United States Patent
Sugano et al.

(10) Patent No.: US 10,889,061 B2
(45) Date of Patent: Jan. 12, 2021

(54) INFORMATION PROCESSING APPARATUS AND INFORMATION PROCESSING METHOD

(71) Applicant: SONY CORPORATION, Tokyo (JP)

(72) Inventors: Hisako Sugano, Kanagawa (JP); Kohei Miyamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/747,852

(22) PCT Filed: Jul. 15, 2016

(86) PCT No.: PCT/JP2016/071091
§ 371 (c)(1),
(2) Date: Jan. 26, 2018

(87) PCT Pub. No.: WO2017/033620
PCT Pub. Date: Mar. 2, 2017

(65) Prior Publication Data
US 2018/0215099 A1 Aug. 2, 2018

(30) Foreign Application Priority Data

Aug. 25, 2015 (JP) .................................. 2015-165875

(51) Int. Cl.
*B29C 64/386* (2017.01)
*G06F 30/00* (2020.01)
(Continued)

(52) U.S. Cl.
CPC ............ *B29C 64/386* (2017.08); *B33Y 50/00* (2014.12); *G05B 19/4099* (2013.01);
(Continued)

(58) Field of Classification Search
None
See application file for complete search history.

(56) References Cited

U.S. PATENT DOCUMENTS

2005/0179956 A1* 8/2005 Silverbrooks ........ B41J 2/17513
358/3.28
2014/0244018 A1 8/2014 Bach et al.
2015/0100455 A1 4/2015 Kitou et al.

FOREIGN PATENT DOCUMENTS

CA 2840853 A1 1/2013
CN 103764237 A 4/2014
(Continued)

OTHER PUBLICATIONS

Yoshiyasu, et al., "Capturing Detailed Body Shapes Using Standard Digital Camera", The Institute of Electronics, Information and Communication Engineers, NII—Electronic Library Service, 2011, vol. J94-D, No. 3, pp. 582-592.
(Continued)

*Primary Examiner* — Mohammad Ali
*Assistant Examiner* — Saad M Kabir
(74) *Attorney, Agent, or Firm* — Chip Law Group

(57) ABSTRACT

An information processing apparatus that acquires default design information of a product and target information of a target to which the product is to be adapted. The information processing apparatus further generates design information adapted to the target from the default design information on a basis of the target information.

13 Claims, 16 Drawing Sheets

(51) Int. Cl.
  *B33Y 50/00* (2015.01)
  *G05B 19/4099* (2006.01)
  *B29L 31/48* (2006.01)

(52) U.S. Cl.
  CPC .......... *G06F 30/00* (2020.01); *B29L 2031/48* (2013.01); *G05B 2219/35134* (2013.01); *G05B 2219/45222* (2013.01); *G05B 2219/49007* (2013.01)

(56) References Cited

FOREIGN PATENT DOCUMENTS

| EP | 2729225 A1 | 5/2014 |
|---|---|---|
| JP | 2001-209799 A | 8/2001 |
| JP | 2008-210168 A | 9/2008 |
| JP | 2014-523025 A | 9/2014 |
| JP | 2015-072639 A | 4/2015 |
| KR | 10-2014-0061373 A | 5/2014 |
| MX | 2014000013 A | 2/2014 |
| WO | 2013/004720 A1 | 1/2013 |

OTHER PUBLICATIONS

Yoshiyasu, et al., "Capturing Detailed Body Shapes Using Standard Digital Camera", The Institute of Electronics, Information and Communication Engineers, vol. J94-D, No. 3, Mar. 2011, pp. 582-592.

Yoshiyasu, et al. "Capturing Detailed Body Shapes Using Standard Digital Camera", The Institute of Electronics, Information and Communication Engineers. D, vol. J94-D, No. 3, Mar. 1, 2011, pp. 582-592.

International Search Report and Written Opinion of PCT Application No. PCT/JP2016/071091, dated Oct. 11, 2016, 09 pages of ISRWO.

* cited by examiner

FIG. 1
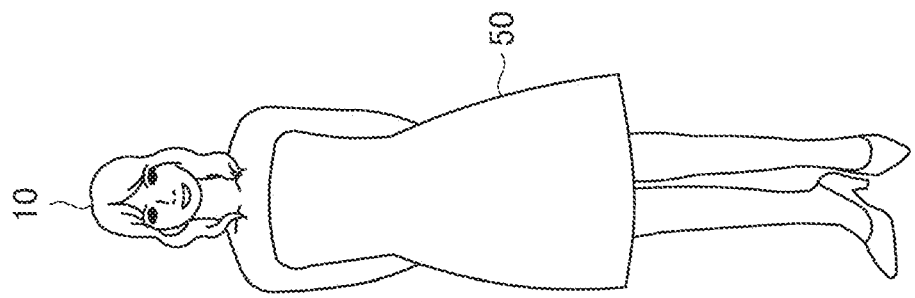
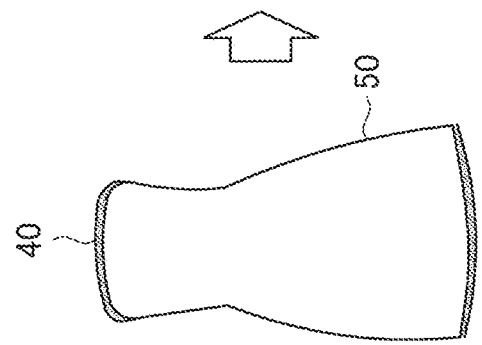
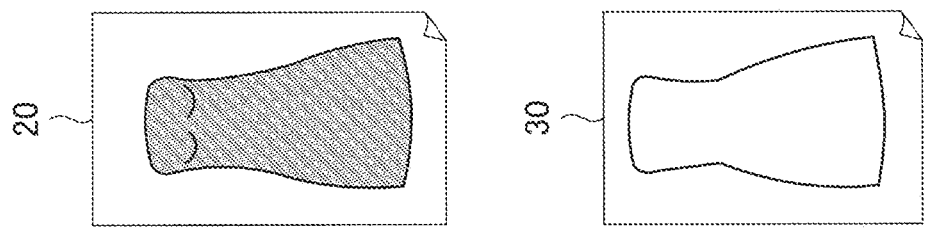
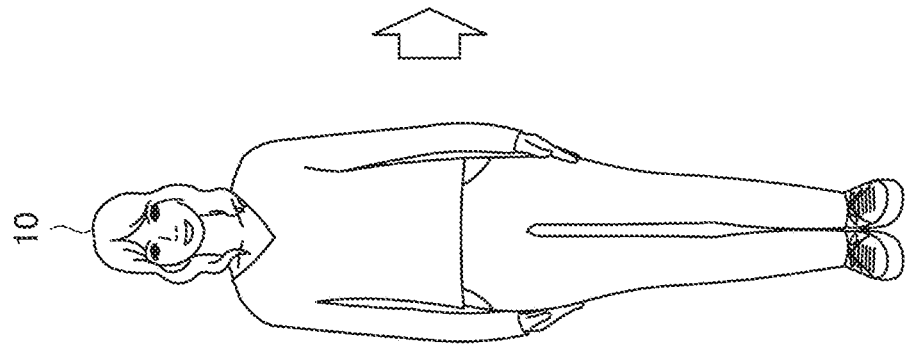

INFORMATION PROCESSING APPARATUS AND INFORMATION PROCESSING METHOD

CROSS REFERENCE TO RELATED APPLICATIONS

This application is a U.S. National Phase of International Patent Application No. PCT/JP2016/071091 filed on Jul. 15, 2016, which claims priority benefit of Japanese Patent Application No. JP 2015-165875 filed in the Japan Patent Office on Aug. 25, 2015. Each of the above-referenced applications is hereby incorporated herein by reference in its entirety.

TECHNICAL FIELD

The present disclosure relates to an information processing apparatus, an information processing method, and a program.

BACKGROUND ART

In recent years, the technologies have been actively developed that connect a three-dimensional object in real space to data (three-dimensional information). One of such technologies includes, for example, the technology (e.g., 3D scanner) of measuring three-dimensional information of a three-dimensional object in real space, or the technology (e.g., 3D printer) of reproducing a three-dimensional object in real space on the basis of three-dimensional information. In these technologies, it is required to more accurately measure or reproduce three-dimensional information.

For example, Patent Literature 1 below discloses the technology that relates to the former technology, and takes, when acquiring three-dimensional information of a three-dimensional object from a captured image, a model of a three-dimensional object into consideration to acquire natural three-dimensional information of the target.

CITATION LIST

Patent Literature

Patent Literature 1: JP 2001-209799A

DISCLOSURE OF INVENTION

Technical Problem

The technology described in Patent Literature 1 above is a technology that makes a correction based on a three-dimensional model in order to improve the measurement accuracy. However, with regard to the latter technology, it is insufficient in some cases to simply improve the reproduction accuracy. For example, it is more desirable in some cases depending on the use of a reproduced three-dimensional object to transform the three-dimensional object, or the like and then reproduce the three-dimensional object than to just reproduce the three-dimensional object.

Accordingly, the present disclosure proposes a novel and improved information processing apparatus, information processing method, and program that make it possible to appropriately edit a three-dimensional object, and then reproduce the three-dimensional object.

Solution to Problem

According to the present disclosure, there is provided an information processing apparatus including: a first acquisition unit configured to acquire default design information of a product; a second acquisition unit configured to acquire target information of a target to which the product is to be adapted; and a generation unit configured to generate design information adapted to the target from the default design information acquired by the first acquisition unit on a basis of the target information acquired by the second acquisition unit.

In addition, according to the present disclosure, there is provided an information processing method including: acquiring default design information of a product; acquiring target information of a target to which the product is to be adapted; and generating, by a processor, design information adapted to the target from the acquired default design information on a basis of the acquired target information.

In addition, according to the present disclosure, there is provided a program for causing a computer to function as: a first acquisition unit configured to acquire default design information of a product; a second acquisition unit configured to acquire target information of a target to which the product is to be adapted; and a generation unit configured to generate design information adapted to the target from the default design information acquired by the first acquisition unit on a basis of the target information acquired by the second acquisition unit.

Advantageous Effects of Invention

As described above, according to the present disclosure, it is possible to appropriately edit a three-dimensional object, and then reproduce the three-dimensional object. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is an explanatory diagram for describing an overview of a manufacturing system according to an embodiment.

MODE(S) FOR CARRYING OUT THE INVENTION

Figure 2:
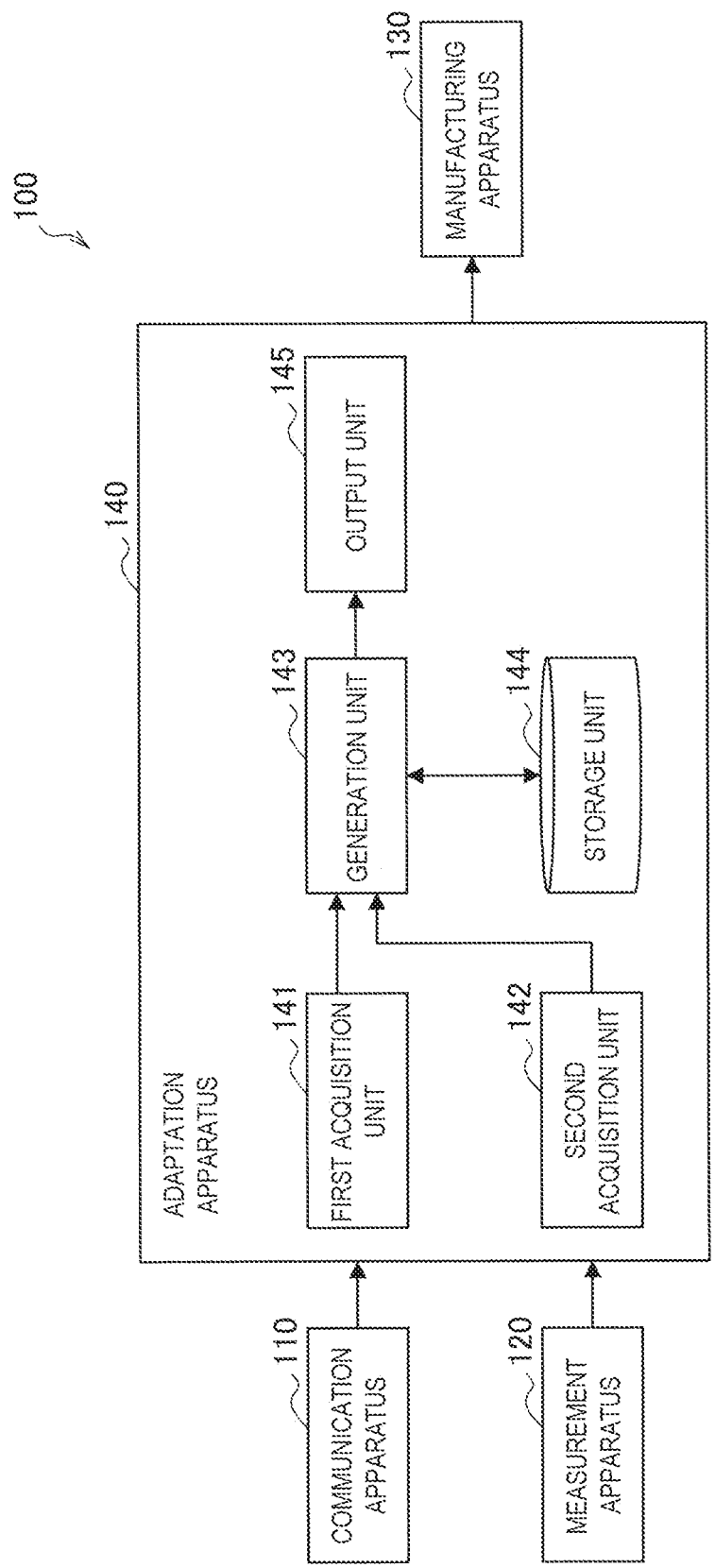
FIG. 2 is a block diagram illustrating an example of a logical configuration of the manufacturing system according to the embodiment.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Introduction
1.1. Technical Problem
1.2. Overview
2. Configuration Example
3. First Embodiment
3.1. Technical Features
3.2. Flow of Processing
4. Second Embodiment
4.1. Technical Features
4.2. Flow of Processing
5. Hardware Configuration Example
6. Conclusion

1. INTRODUCTION

First, a technical problem of the present technology and the overview of the present technology will be described.
<1.1. Technical Problem>

As a technology of reproducing a three-dimensional object in real space on the basis of design information (e.g., three-dimensional information), a 3D printer is known. The 3D printer is an apparatus that manufactures a product by printing a shape indicated by three-dimensional information while laminating designated materials, or the like.

In recent years, various types of 3D printers have been developed. Examples include a type of 3D printer that uses resin as a material, a type of 3D printer for optical fabrication, a type of 3D printer capable of concurrently printing with a plurality of materials, and the like. Diverse types of products such as objets d'art, food, and western clothing are manufacturable.

In the present circumstances, products that have been manufactured (i.e., printed) are sold in most cases. However, 3D printers will be disposed near users (e.g., users themselves possess 3D printers, and the like) in the future, and users are predicted to print by themselves in more cases. In the case where a user prints by himself or herself, there are two types of methods for acquiring design information input into a 3D printer: a method in which the user himself or herself makes the design information; and a method in which existing data is used. Examples of the former include a method in which the user himself or herself uses design software such as CAD to manually generate the design information, and a method in which the design information is automatically generated on the basis of a 3D scan result of a device including an infrared sensor or the like. Examples of the latter include a method in which the design information is downloaded.

No matter which method is used to acquire design information, it is required in some cases to edit (i.e., change) the design information. Examples include the case where design information is edited such that it is possible to print the design information in accordance with the performance of a 3D printer (e.g., maximum size, material, accuracy, or the like). In the case where design information is in the environment in which the design information is editable, a user is able to change the size, the position of an apex, the texture, and the color. However, it takes time to edit design information, and the degree of editing freedom is sometimes low in the first place in the case where existing design information is used.

A 3D printer sometimes uses a support member to manufacture a product that has a part which is delicate and low in strength or weak against pressure, or has a hollow part. The support member is an auxiliary member that a 3D printer uses to manufacture a product, and supports a material which is being manufactured to prevent the material from falling or transforming. As a support member, the same material as that of a product may be used, or a water-soluble or flexible material or the like different from that of the product may be used to facilitate the support member to be removed. In the former case, the product and the support member are concurrently printed as one object. Meanwhile, in the latter case, the product is printed adjacent to or printed and superimposed on the position of the support member prepared in advance. Anyway, in the case where design information does not include information regarding a support member, it is desirable to add the information. In the case where the design information is edited, it is also desirable to edit the information regarding the support member in the same way.

However, in the present circumstances, products that have been printed are sold in most cases. Accordingly, it is difficult in many cases to edit the acquired design information.

Thus, in view of the above-described circumstances, a manufacturing system according to an embodiment of the present disclosure has been devised. The manufacturing system according to the present embodiment is capable of easily editing acquired design information. More specifically, the manufacturing system is capable of editing design information to adapt the design information to any object.
<1.2. Overview>

Next, the overview of the manufacturing system according to the present embodiment will be described.

As described above, the manufacturing system according to the present embodiment is capable of editing design information to adapt the design information to any object. In addition, in the case where the manufacturing system according to the present embodiment uses a support member, the manufacturing system according to the present embodiment is also capable of editing design information to adapt the support member to any object.

A variety of adaptation targets are conceivable. For example, an adaptation target may be a room, and design information of furniture may be edited to adapt to the room. In addition, an adaptation target may be a robot, and design information of a part of the robot may be edited to adapt to the robot. In addition, an adaptation target may be a smartphone, and design information of a smartphone cover may be edited to adapt to the smartphone. Additionally, as a product, a bracelet, a toy for a child, tableware such as a handle of a cup, western clothing for a pet, and the like are conceivable. As an example, an example in which an adaptation target is a user (i.e., human), and design information of clothing is edited to adapt to the user will be herein described chiefly. With reference to FIG. 1, the following describes the overview of the manufacturing system according to the present embodiment.

FIG. 1 is an explanatory diagram for describing the overview of the manufacturing system according to the present embodiment. As illustrated in FIG. 1, the manufacturing system generates design information 20 of a support member that is adapted to (fit into) a user 10, and design information 30 of clothing. For example, information such as the height, the weight, and the position of a joint of the user 10 can be taken into consideration for the adaptation. Additionally, the manufacturing system prints the support member 40 in accordance with the design information 20, and then prints clothing 50 in accordance with the design information 30. In this way, the (personalized) clothing 50 that fits into the user 10 is manufactured.

Note that a support member is used in many cases to print an object having a hollow part like clothing, but in the case where a technology such as optical fabrication is employed, a support member is unnecessary. In the case where the manufacturing system according to the present embodiment employs a technology that eliminates the necessity of a support member, the adaptation and manufacture of a support member are omitted.

The above describes the overview of the manufacturing system according to the present embodiment. Next, a configuration example of the manufacturing system according to the present embodiment will be described.

2. CONFIGURATION EXAMPLE

FIG. 2 is a block diagram illustrating an example of the logical configuration of a manufacturing system 100 according to the present embodiment. As illustrated in FIG. 2, the manufacturing system 100 includes a communication apparatus 110, a measurement apparatus 120, a manufacturing apparatus 130, and an adaptation apparatus 140.

(1) Communication Apparatus 110

The communication apparatus 110 is a communication module for transmitting and receiving data to and from another apparatus in a wired/wireless manner. For example, the communication apparatus 110 connects to a server capable of downloading design information, receives the design information, and outputs the design information to the adaptation apparatus 140. The design information output here is design information that has not yet been adapted.

(2) Measurement Apparatus 120

The measurement apparatus 120 is an apparatus that measures (what is called 3D scan) the three-dimensional shape of a target. The measurement apparatus 120 may include a variety of sensors such as a camera, an infrared sensor, and a depth sensor, and can also be referred to as 3D scanner. The measurement apparatus 120 according to the present embodiment measures the three-dimensional shape of an adaptation target, and outputs a measurement result to the adaptation apparatus 140. The measurement apparatus 120 can have a variety of shapes such as a handy type shape or a dome (omnidirectional) type shape. In addition, the measurement apparatus 120 can employ a variety of measurement methods such as an active measurement method or a passive measurement method.

(3) Manufacturing Apparatus 130

The manufacturing apparatus 130 is an apparatus that manufactures on the basis of design information. The manufacturing apparatus 130 manufactures a product on the basis of adapted design information output from the adaptation apparatus 140. For example, the manufacturing apparatus 130 is a lamination type, jet type, immersion type, or the like of 3D printer.

(4) Adaptation Apparatus 140

The adaptation apparatus 140 has a function of adapting input design information to an adaptation target. As illustrated in FIG. 2, the adaptation apparatus 140 according to the present embodiment includes a first acquisition unit 141, a second acquisition unit 142, a generation unit 143, a storage unit 144, and an output unit 145. The functions of these respective components will be described in detail below.

The above describes the configuration example of the manufacturing system 100 according to the present embodiment. Next, technical features of the adaptation apparatus 140 according to the present embodiment will be described.

3. FIRST EMBODIMENT

<3.1. Technical Features>
(1) Target Information

The adaptation apparatus 140 (e.g., second acquisition unit 142) acquires information of an adaptation target. The information of an adaptation target will also be referred to as target information below.

Figure 3:
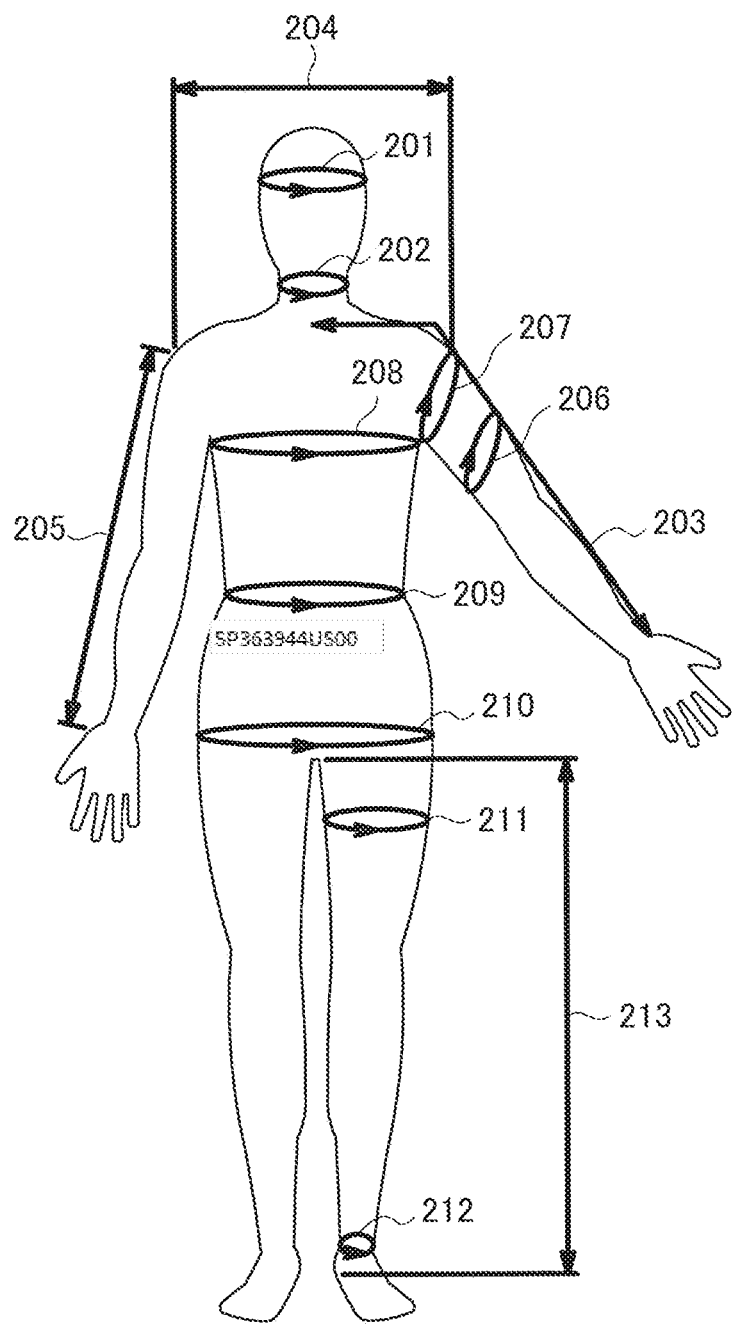
FIG. 3 is an explanatory diagram for describing an example of target information according to a first embodiment.

The target information includes three-dimensional information of an adaptation target. The three-dimensional information of an adaptation target includes information indicating, for example, the external actual size, shape, and the like of the adaptation target. With regard to clothing, the measure of the actual size of a person illustrated in FIG. 3 can be included in the target information. FIG. 3 is an explanatory diagram for describing an example of target information according to the present embodiment. For example, as illustrated in FIG. 3, the target information can include the measure of a head circumference 201, a neck circumference 202, a neck-to-sleeve length 203, a shoulder length 204, a sleeve length 205, an arm circumference 206, an arm hole 207, a chest circumference 208, a waist 209, a hip 210, a thigh 211, an ankle 212, and an inseam 213. Such three-dimensional information regarding a human is also referred to as skeleton data. Note that the skeleton data may also be two-dimensional information. In that case, the two-dimensional information may be set as three-dimensional information by estimating depth (i.e., thickness) on the basis of attribute information such as the height and the weight, or set as three-dimensional information on the basis of an input of the depth made by a user.

Figure 4:
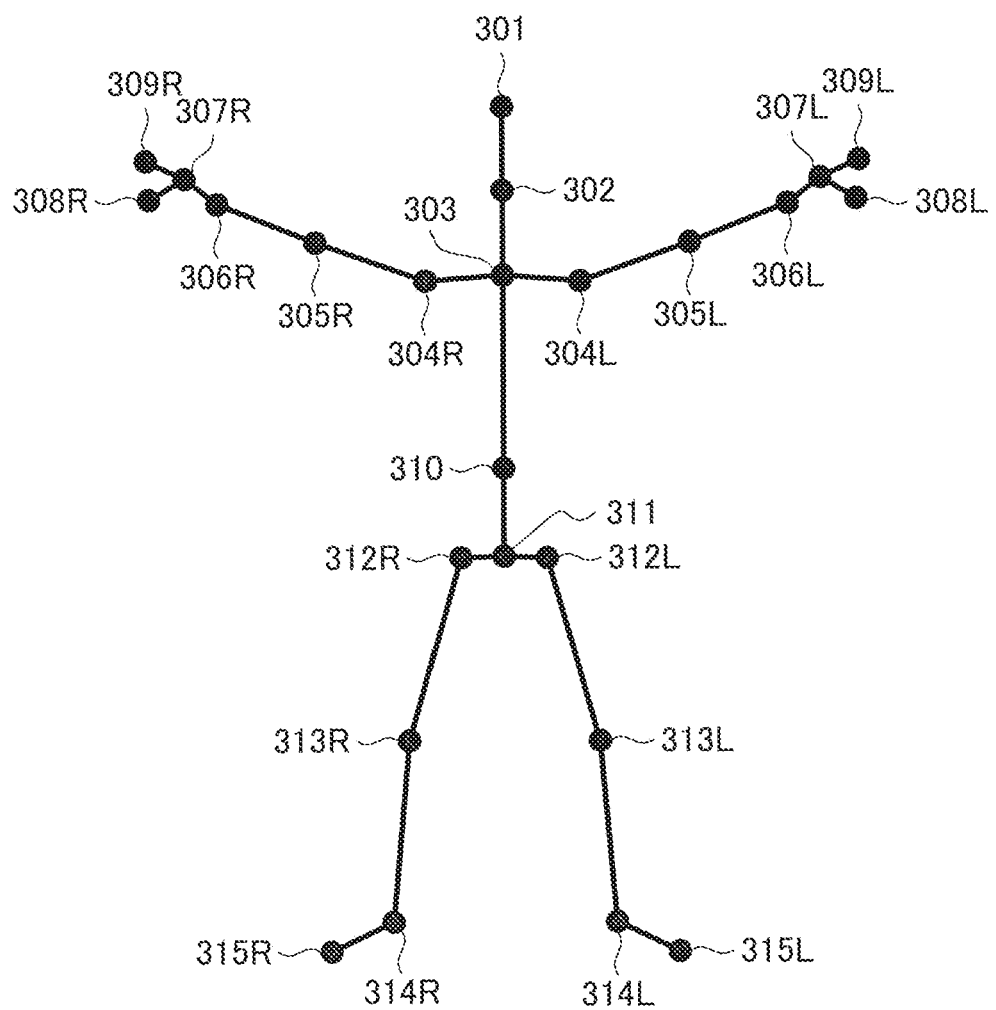
FIG. 4 is an explanatory diagram for describing an example of a feature point of an adaptation target according to the embodiment.

The target information includes three-dimensional information of feature points of an adaptation target. The three-dimensional information of feature points includes information indicating, for example, the coordinates of the feature points, the positional relationship between the feature points, and the like. In the case where an adaptation target is a human, the three-dimensional information of feature points can include, for example, the coordinates (e.g., relative coordinates with the position of the waist as the origin) of each point of the body such as the right shoulder, the left shoulder, and the right elbow. FIG. 4 illustrates an example of feature points of a human. FIG. 4 is an explanatory diagram for describing an example of a feature point of an adaptation target according to the present embodiment. As illustrated in FIG. 4, feature points of a human include a head 301, a neck 302, a shoulder center 303, a spine 310, and a waist center 311, which are positioned at the center of the body. In addition, feature points of a human include a right shoulder 304R, a right elbow 305R, a right wrist 306R, a right hand 307R, a right thumb 308R, a right hand tip 309R, a right waist 312R, a right knee 313R, a right heel 314R, and a right foot 315R, which are positioned on the right side of the body. In addition, feature points of a human include a left shoulder 304L, a left elbow 305L, a left wrist 306L, a left hand 307L, a left thumb 308L, a left hand tip 309L, a left waist 312L, a left knee 313L, a left heel 314L, and a left foot 315L, which are positioned on the left side of the body.

Three-dimensional information of an adaptation target and/or three-dimensional information of feature points of an adaptation target may be acquired, for example, by the measurement apparatus 120 directly scanning the adaptation target. It is desirable that these kinds of information be both actual-size information. In the case where any one of these kinds of information is not actual-size information (but, for example, relative-size information), the adaptation apparatus 140 converts the information to actual-size information in accordance with the other actual-size information.

The adaptation apparatus 140 (e.g., second acquisition unit 142) may acquire attribute information of an adaptation target as target information, and estimate three-dimensional information of the adaptation target from the attribute information. With regard to clothing, the adaptation apparatus 140 may estimate the actual size of the human illustrated in FIG. 3 or the coordinates of feature points of the human illustrated in FIG. 4, for example, on the basis of attribute information such as the height, the weight, and the sex of a user.

(2) Product Design Information

The adaptation apparatus 140 (e.g., first acquisition unit 141) acquires default design information of a product. The design information of a product will also be referred to as product design information below.

The product design information includes three-dimensional information and texture information of a product. The three-dimensional information of a product includes information indicating, for example, the coordinates of three-dimensional point group that form the product, a polygon mesh that connects those points, the normal vector of each polygon, and the like. The texture information is information indicating the texture (e.g., colors, irregularities, and the like) of each polygon.

The product design information may include information indicating apices in three-dimensional information of a product which correspond to feature points of an adaptation target. With regard to clothing, such information indicating apices is information indicating, for example, the apex corresponding to the right shoulder 304R, and the apex corresponding to the left shoulder 304L illustrated in FIG. 4. The relationships may be included in the product design information in advance, or designated by a user.

The product design information may include an adaptation rule. The adaptation rule includes information indicating a restriction as to changes in the product design information. For example, the adaptation rule includes information indicating a restriction of changes as to three-dimensional information or texture information of a product. With regard to clothing, the adaptation rule can include information indicating, for example, restrictions (e.g., thresholds) as to the margin amount, the texture amount per unit area, the balance between the shoulder length and the sleeve length, and the like. Additionally, the adaptation rule can include information indicating whether local enlargement and reduction are permitted or not, information indicating the areas that are permitted enlargement and reduction and the areas that not permitted, information indicating the upper limits of the enlargement ratio and reduction ratio, and the like. An adaptation rule that is common, for example, to each type of product (e.g., clothing for men, clothing for women, smartphone covers, or the like) may be employed, or a designer may set an adaptation rule for each product.

(3) Support Member Design Information

Design information of a support member includes information indicating, for example, the coordinates of the three-dimensional point group that form the support member and the polygon meshes that connect those points, the normal vector of each polygon, and the like. The design information of a support member will also be referred to as support member design information below. The support member design information may be included in default product design information, or generated by the adaptation apparatus 140. In any case, as described below, the support member design information is also adapted along with the adaptation of the product design information.

(4) Adaptation Processing of Product Design Information

The adaptation apparatus 140 (e.g., generation unit 143) generates product design information adapted to a target from default product design information, on the basis of target information.

For example, the adaptation apparatus 140 may correct default product design information on the basis of three-dimensional information of an adaptation target to generate adapted product design information. For example, on the basis of three-dimensional information of an adaptation target, the adaptation apparatus 140 enlarges or reduces the spaces between the respective apices of three-dimensional information included in product design information to achieve the enlargement or reduction of a product. With regard to clothing, the adaptation apparatus 140 enlarges or reduces the default measure of clothing in accordance with the actual size of a user. Note that the enlargement ratio and the reduction ratio may be partially different or the same as a whole. This makes it possible to adapt a product to an adaptation target, and make, for example, clothing fit the contours of a user.

Specifically, the adaptation apparatus 140 compares the spaces between the respective apices in default product design information with the spaces between the corresponding parts in target information to calculate the enlargement ratio or the reduction ratio. The adaptation apparatus 140 uses this enlargement or reduction ratio to enlarge or reduce, or move a polygon in the default product design information. An equation (1) below shows an augmented matrix of a polygon. In addition, an equation (2) below shows a movement matrix of a polygon. The adaptation apparatus 140 uses these matrixes to compute the enlargement or reduction (i.e., enlargement or reduction of the spaces between the apices) of a polygon, and the movement (i.e., movement of the apices) of a polygon.

[Math. 1]

$$\begin{pmatrix} X \\ Y \\ Z \\ 1 \end{pmatrix} = \begin{pmatrix} S_x & 0 & 0 & 0 \\ 0 & S_y & 0 & 0 \\ 0 & 0 & S_z & 0 \\ 0 & 0 & 0 & 1 \end{pmatrix} \quad (1)$$

[Math. 2]

$$\begin{pmatrix} X \\ Y \\ Z \\ 1 \end{pmatrix} = \begin{pmatrix} 1 & 0 & 0 & T_x \\ 0 & 1 & 0 & T_y \\ 0 & 0 & 1 & T_z \\ 0 & 0 & 0 & 1 \end{pmatrix} \quad (2)$$

Here, $S_x$ represents the enlargement ratio or reduction ratio in an X-axis direction. $S_y$ represents the enlargement ratio or reduction ratio in a Y-axis direction. $S_z$ represents the enlargement ratio or reduction ratio in a Z-axis direction. In addition, $T_x$ represents the movement distance in the X-axis direction. $T_y$ represents the movement distance in the Y-axis direction. $T_z$ represents the movement distance in the Z-axis direction.

In addition, for example, the adaptation apparatus 140 may associate the feature points of an adaptation target with the corresponding apices of a product to make adaptation. Specifically, the adaptation apparatus 140, for example, moves the positions of the corresponding apices of the product (e.g., enlarges or reduces the spaces between the apices) such that the positions of the apices agree with the positions of the feature points of the adaptation target. Additionally, the adaptation apparatus 140 moves the apices of a product (e.g., provides margins to clothing), for example, in accordance with behavior (e.g., movement of human joints) assumed for feature points. This allows the product to be adapted to the adaptation target. With regard to clothing, for example, it is possible to fit clothing to the positions of the joints of a user, and prevent the clothing from interfering with the movement of the joints.

In addition, for example, the adaptation apparatus 140 may make adaptation in accordance with an adaptation rule included in product design information. This prevents, for example, an adaptation result from being far apart from the default and deviating from the intention of a designer. With regard to clothing, for example, product design information of loose design clothing prevents close-fitting clothing from being manufactured.

In addition, for example, the adaptation apparatus 140 may adapt texture information. With regard to clothing, the adaptation apparatus 140 may make a change to a color that matches, for example, the skin color, hair color, hair style, and the like of a user.

In addition, for example, the adaptation apparatus 140 may set the generation policy of product design information on the basis of the presence of a movable portion included in an adaptation target. The generation policy includes, for example, a normal mode, an avoidance mode, and a blank space addition mode. In the normal mode, the adaptation apparatus 140 does not make a change that takes a movable portion into consideration. In the avoidance mode, the adaptation apparatus 140 deletes a portion corresponding to a movable portion from product design information to manufacture a product that avoids the corresponding portion. In the blank space addition mode, the adaptation apparatus 140 takes the movement of a movable portion into consideration, and applies a change such as inflating, thinning, or using a highly stretchable material for the portion corresponding to the movable portion not to interfere with the movement of the movable portion in the case where a product that covers the movable portion is manufactured. Setting such a generation policy makes it possible to appropriately manufacture a product such as a smartphone cover with no movable portion, and a product such as clothing or a robot including a movable portion.

In addition, for example, the adaptation apparatus 140 may add or delete an apex to or from three-dimensional information of a product included in design information. This allows a portion having sparser or denser distribution of apices due to the enlargement or reduction of a product to have predetermined distribution density again. Note that the addition of apices means the addition of a polygon including the added apices or the added apices and existing apices (i.e., division of an existing polygon). In addition, the deletion of apices means the deletion of the polygon including the deleted apices (i.e., integration of existing polygons). In the case where a polygon is divided, the texture information corresponding to the polygon before the division is assigned to the divided polygons. In the case where polygons are integrated, the texture information corresponding to the polygons before the integration is assigned to the integrated polygon. Here, with reference to FIGS. 5 and 6, the addition and deletion of apices will be described.

Figure 5:
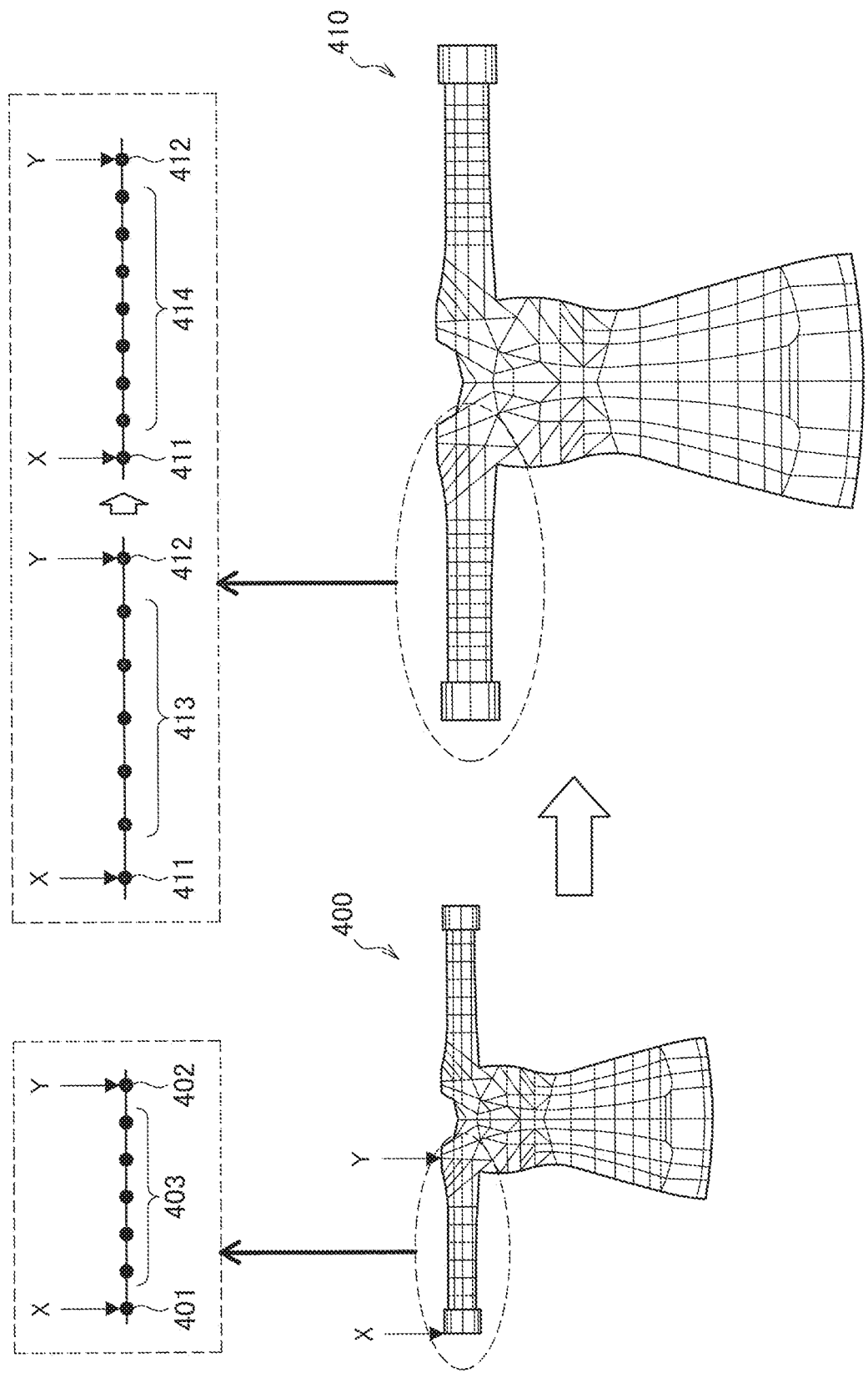
FIG. 5 is an explanatory diagram for describing an example of adaptation processing according to the embodiment.
Figure 6:
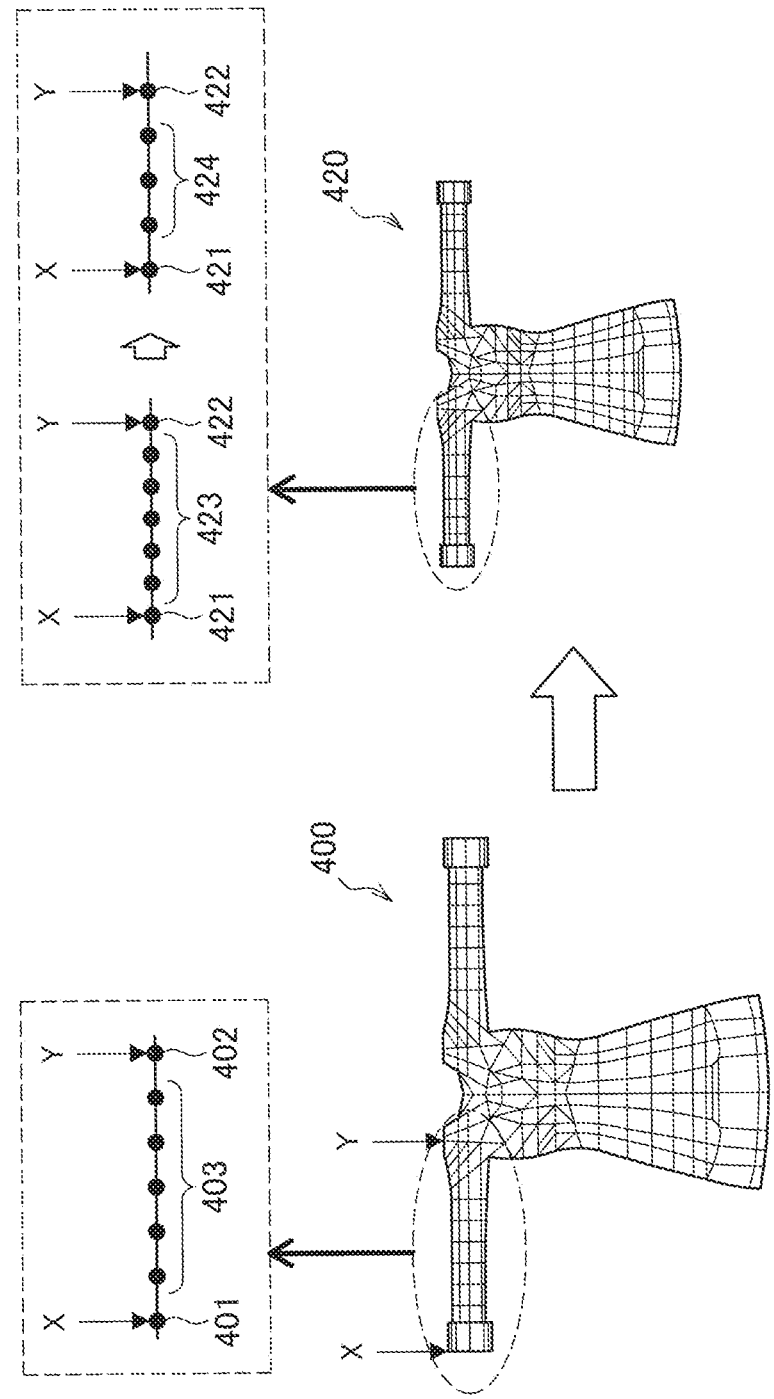
FIG. 6 is an explanatory diagram for describing an example of the adaptation processing according to the embodiment.

FIGS. 5 and 6 are explanatory diagrams each for describing an example of adaptation processing according to the present embodiment. Here, it is assumed that default product design information is product design information of ladies clothing designed for the average height and weight of typical women. If a sleeve portion comes into focus in three-dimensional information 400 of default product design information illustrated in FIGS. 5 and 6, an apex 401 corresponding to a wrist portion X, an apex 402 corresponding to a shoulder portion Y, and an apex group 403 on the line connecting the apex 401 to the apex 402 are shown. First, the adaptation apparatus 140 makes adaptation by enlarging or reducing the spaces of respective apices of three-dimensional information included in product design information from the default on the basis of whether the height of a user is greater than the average height or not. However, while the spaces between the apices are enlarged or reduced, the number of polygons, polygon shape, texture and the like can vary. Accordingly, the adaptation apparatus 140 adds or deletes an apex to resolve such variations.

In the example illustrated in FIG. 5, the adaptation apparatus 140 enlarges the spaces between the respective apices of the three-dimensional information 400 included in the default product design information to generate three-dimensional information 410. As illustrated in FIG. 5, when enlarged, the space between an apex 411 corresponding to the wrist portion X and an apex 412 corresponding to the shoulder portion Y widens, and the spaces of an apex group 413 on the line connecting the apex 411 to the apex 412 also get wider than the default. Therefore, the area of one polygon gets larger. When the area of one polygon gets larger, the texture included in that area thins down (e.g., pattern gets gradually blurred). Therefore, the adaptation apparatus 140 adds one or more apices to the apex group 413 and adjusts the spaces to make an apex group 414. In this way, polygon size is prevented from being far apart from the default. The adaptation apparatus 140 adds apices all over in such a way to make adaptation.

In the example illustrated in FIG. 6, the adaptation apparatus 140 reduces the spaces between the respective apices of the three-dimensional information 400 included in the default product design information to generate three-dimensional information 420. As illustrated in FIG. 6, when reduced, the space between an apex 421 corresponding to the wrist portion X and an apex 422 corresponding to the shoulder portion Y narrows, and the spaces of an apex group 423 on the line connecting the apex 421 to the apex 422 also get narrower than the default. Therefore, the area of one polygon gets smaller. When the area of one polygon gets smaller, the texture included in that area gets denser (e.g., pattern is compressed and condensed). Therefore, the adaptation apparatus 140 deletes some of the apices from the apex group 423 between the apex 421 and the apex 422 and adjusts the spaces to make an apex group 424. In this way, polygon size is prevented from being far apart from the default. The adaptation apparatus 140 deletes apices all over in such a way to make adaptation. Note that the deletion of apices is also useful in terms of data amount reduction.

The above describes the addition and deletion of apices arranged on a straight line. Next, with reference to FIGS. 7 and 8, the addition and deletion of apices on a plane, that is, the addition and deletion of polygons will be described.

Figure 7:
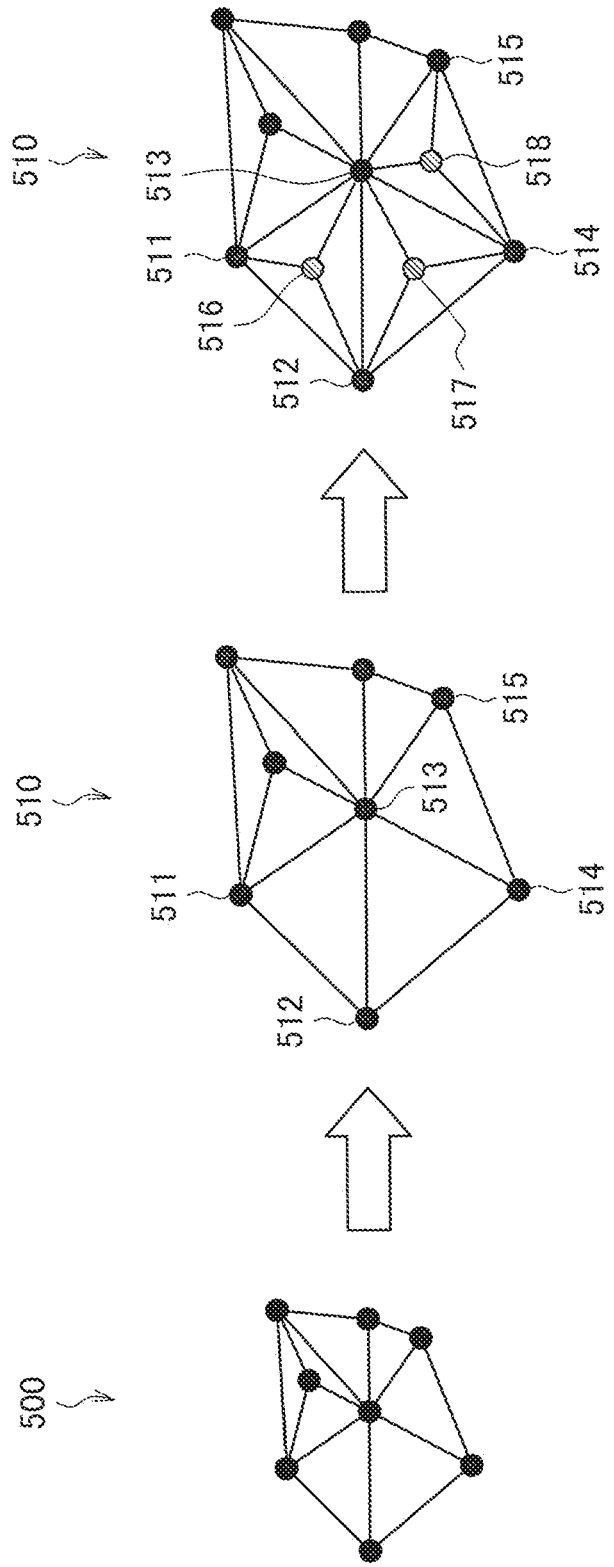
FIG. 7 is an explanatory diagram for describing an example of the adaptation processing according to the embodiment.

FIG. 7 is an explanatory diagram for describing an example of the adaptation processing according to the present embodiment. In the example illustrated in FIG. 7, the adaptation apparatus 140 enlarges the spaces between the respective apices of the three-dimensional information 500 included in the default product design information to generate three-dimensional information 510. In the three-dimensional information 510 after enlargement, it is assumed that the area of the polygon including apices 511, 512, and 513, the polygon including apices 512, 513, and 514, and the polygon including apices 513, 514, and 515 is excessively greater than the default. Note that it is assumed that being excessively greater here refers to being greater than a threshold obtained by adding an offset to the default area. In that case, the adaptation apparatus 140 adds apices 516, 517, and 518 to add (i.e., divide) polygons. This prevents the area of the enlarged polygons from being excessively greater than the default. Polygons can be added, for example, by adding apices at the center of existing polygons (e.g., triangle's center of gravity).

Figure 8:
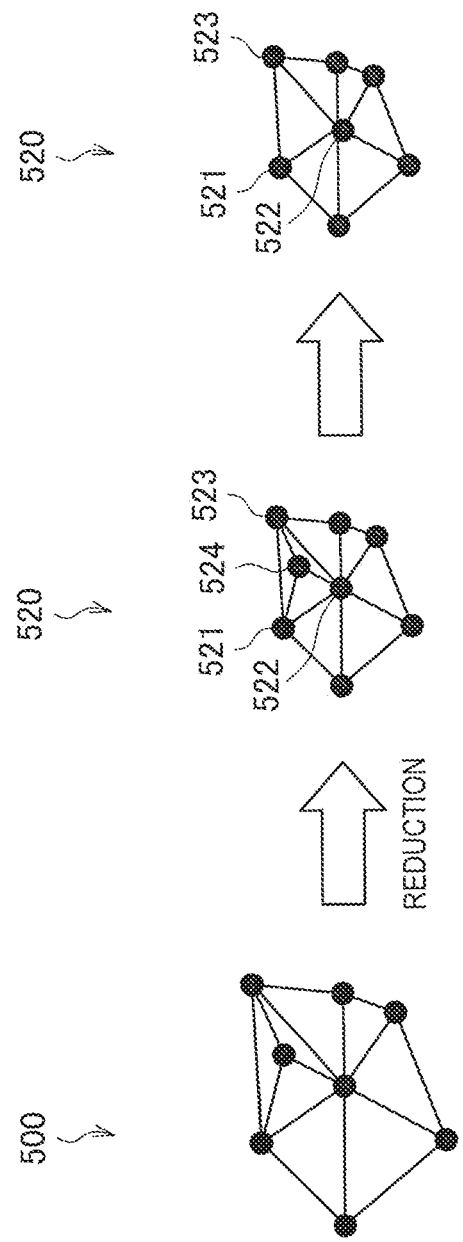
FIG. 8 is an explanatory diagram for describing an example of the adaptation processing according to the embodiment.

FIG. 8 is an explanatory diagram for describing an example of the adaptation processing according to the present embodiment. In the example illustrated in FIG. 8, the adaptation apparatus 140 reduces the spaces between the respective apices of the three-dimensional information 500 included in the default product design information to generate three-dimensional information 520. In the three-dimensional information 520 after reduction, it is assumed that the area of the polygon including apices 521, 522, and 524, the polygon including apices 521, 523, and 524, and the polygon including apices 522, 523, and 524 is excessively smaller than the default. Note that it is assumed that being excessively smaller here refers to being smaller than a threshold obtained by subtracting an offset from the default area. In that case, the adaptation apparatus 140 deletes the apex 524 to delete (i.e., integrate) polygons. This prevents the area of the reduced polygons from being excessively smaller than the default.

The above focuses on the area of polygons for description, but the adaptation apparatus 140 may determine whether to add or delete polygons or not, on the basis of the texture amount per unit area of a polygon. The texture amount is a value quantized, for example, by the edge amount, color distribution, point spread function (PSF), light amount, or the like included in the unit area of a polygon. For example, the adaptation apparatus 140 deletes (i.e., integrates) polygons in the case where the texture amount is excessively greater than the default, and the adaptation apparatus 140 adds (i.e., divides) polygons in the case where the texture amount is excessively less than the default. This prevents the texture amount from being far apart from the default.

The above describes the addition and deletion of polygons. Next, with reference to FIG. 9, an example of the flow of processing regarding the addition and deletion of polygons will be described.

Figure 9:
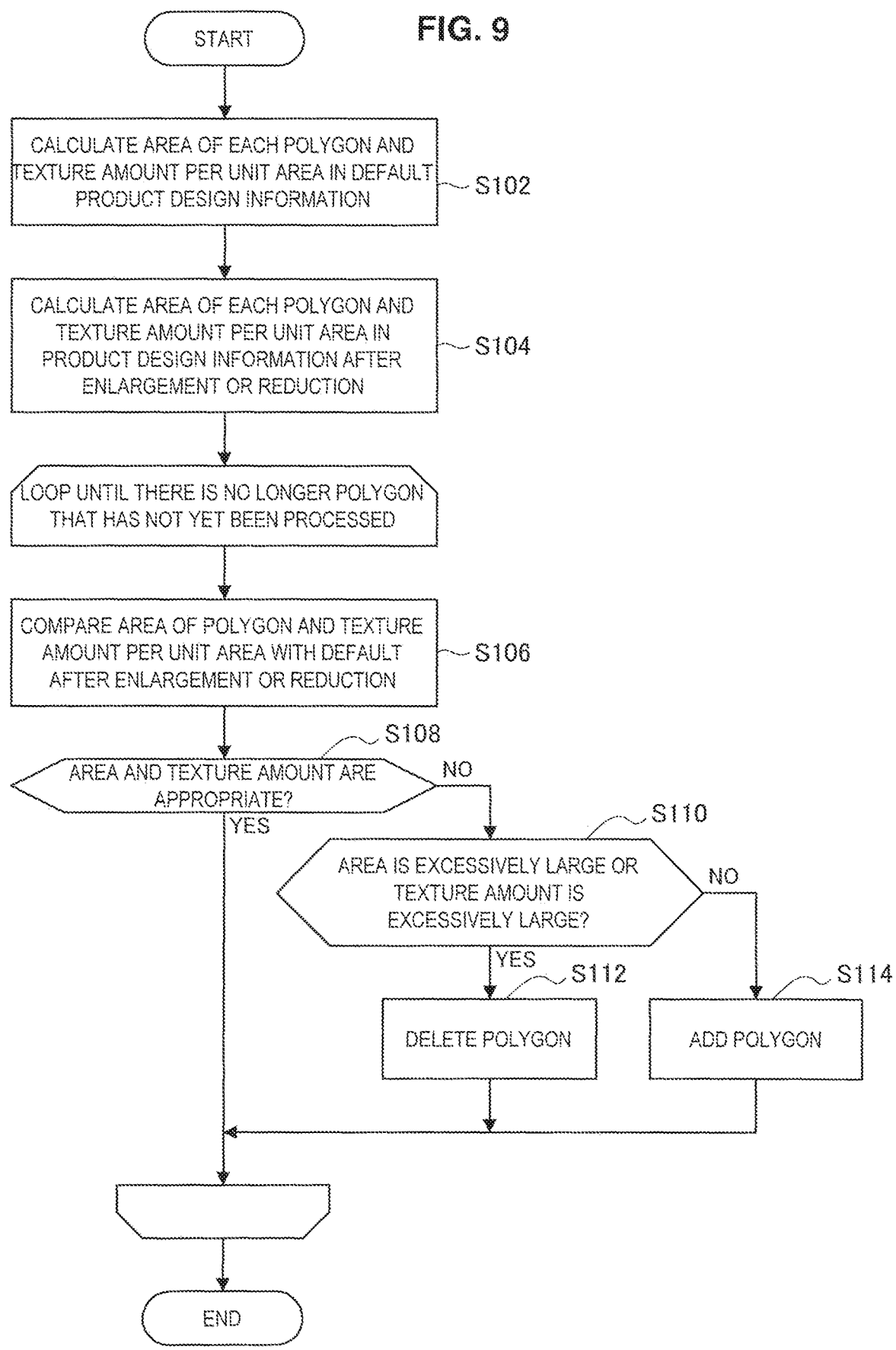
FIG. 9 is a flowchart illustrating an example of a flow of number-of-polygons adjustment processing according to the embodiment.

FIG. 9 is a flowchart illustrating an example of the flow of number-of-polygons adjustment processing according to the present embodiment. As illustrated in FIG. 9, the adaptation apparatus 140 (e.g., generation unit 143) first calculates the area of each polygon and the texture amount per unit area in default product design information (step S102). Next, the adaptation apparatus 140 calculates the area of each polygon and the texture amount per unit area in product design information after enlargement or reduction (step S104). At this time, in the case of enlargement from the default, the area of a polygon gets larger and the texture amount per unit area gets smaller. In contrast, in the case of reduction from the default, the area of a polygon gets smaller and the texture amount per unit area gets larger.

The adaptation apparatus 140 then changes polygons of interest sequentially, and repeatedly performs the following processing. First, the adaptation apparatus 140 compares the area of a polygon of interest and the texture amount per unit area with the default after enlargement or reduction (step S106). In the case where it is determined as a result of the comparison that the area and the texture amount after enlargement or reduction are appropriate (step S108/YES), the adaptation apparatus 140 makes no adjustment regarding the polygon of interest. In contrast, in the case where it is determined that the area or the texture amount after enlargement or reduction is not appropriate (step S108/NO), and in the case where the area is excessively large or the texture amount is excessively large (step S110/YES), the adaptation apparatus 140 deletes a polygon (step S112). In addition, in the case where it is determined that the area or the texture amount after enlargement or reduction is not appropriate (step S108/NO), and in the case where the area is excessively small or the texture amount is excessively small (step S110/NO), the adaptation apparatus 140 adds a polygon (step S114). This processing from step S106 to S114 is repeated until there is no longer a polygon that has not yet been processed.

The number-of-polygons adjustment processing terminates here.

Note that any thresholds can be set for determining whether the area and the texture amount are appropriate or not, and whether the area and the texture amount are excessively large or small. For example, the thresholds may be set in accordance with the manufacturing performance of the manufacturing apparatus 130.

The above describes the addition and deletion of apices (i.e., addition and deletion of polygons).

In addition, for example, the adaptation apparatus 140 may maintain the texture amount per unit area before and after adaptation. For example, the adaptation apparatus 140 maintains, for example, the texture amount per unit area in default product design information, and assigns a texture to each polygon such that the maintained texture amount is reached when the texture is mapped to three-dimensional information after enlargement or reduction. This causes the texture amount per unit area to be the same as the default, so that it is possible to reproduce default design as it is. In addition, it is possible to avoid, even in the case of partial enlargement or reduction, a partial difference in the texture amount. This point will be described with reference to FIGS. 10 and 11.

Figure 10:
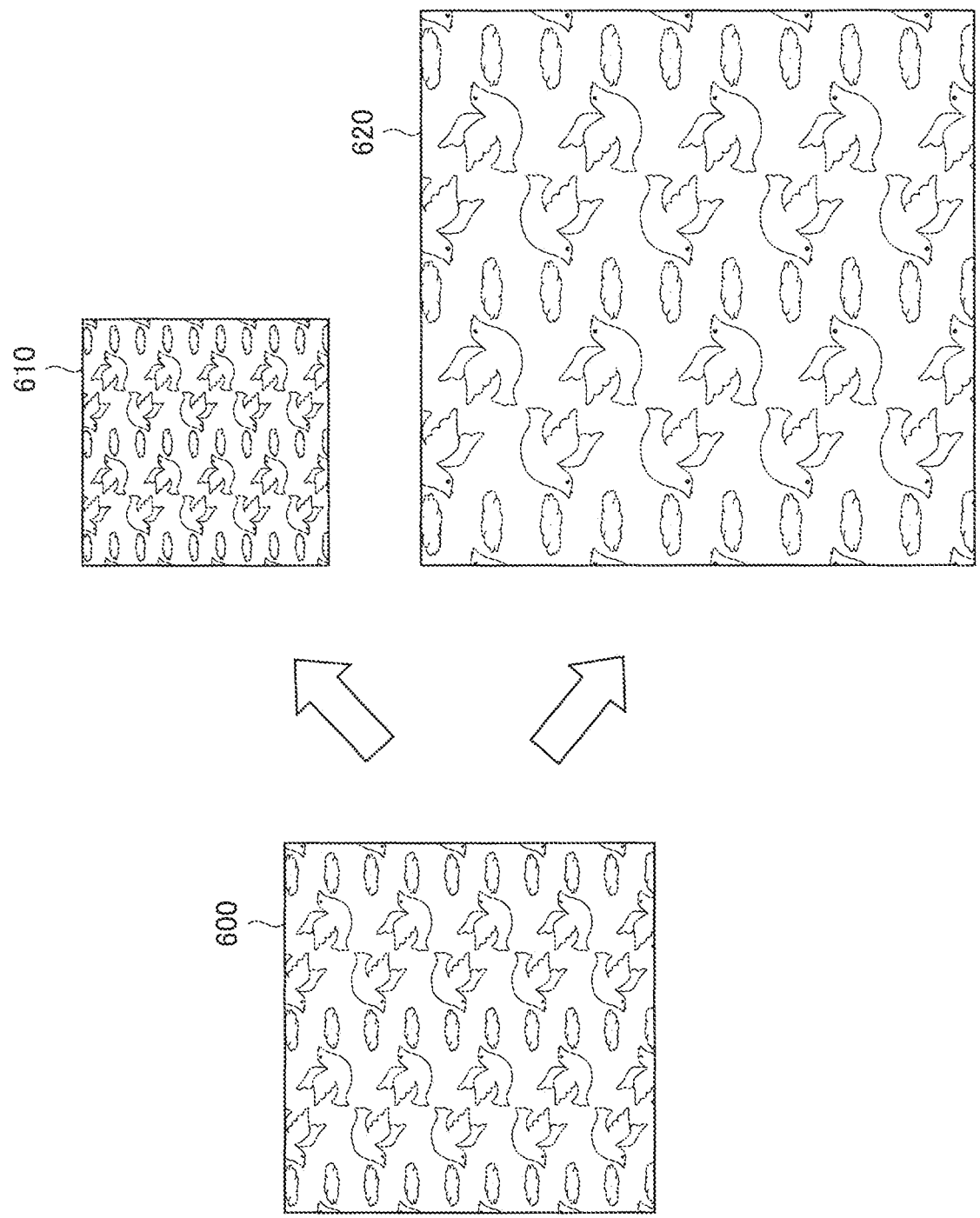
FIG. 10 is an explanatory diagram for describing texture information adaptation according to the embodiment.
Figure 11:
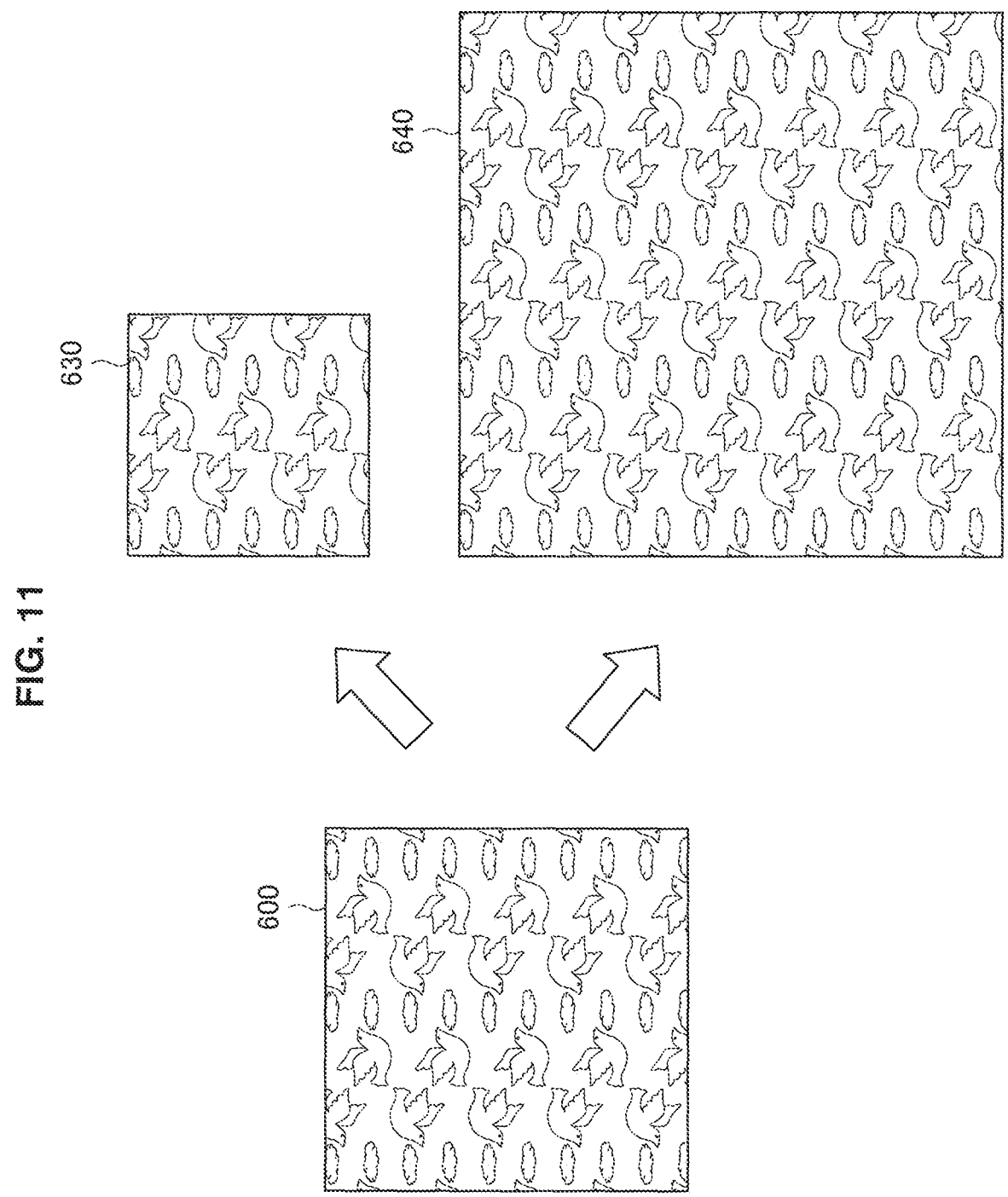
FIG. 11 is an explanatory diagram for describing the texture information adaptation according to the embodiment.

FIGS. 10 and 11 are explanatory diagrams each for describing texture information adaptation according to the present embodiment. FIG. 10 illustrates a default texture 600, a texture 610 that is reduced as it is in accordance with the reduction in the area, and a texture 620 that is enlarged as it is in accordance with the enlargement of the area. A comparison between the texture 600 and the textures 610 and 620 demonstrates that they are different in texture amount (pattern density) per unit. In contrast, FIG. 11 illustrates the default texture 600, a texture 630 that is reduced while maintaining the texture amount per unit area, and a texture 640 that is enlarged while maintaining the texture amount per unit area. A comparison between the texture 600 and the textures 630 and 640 demonstrates that their texture amounts (pattern density) per unit are the same. In the example illustrated in FIG. 11, it is possible to reproduce the default design as it is even after enlargement or reduction.

The above describes a texture amount adjustment. Next, with reference to FIG. 12, an example of the flow of processing related to a texture amount adjustment will be described.

Figure 12:
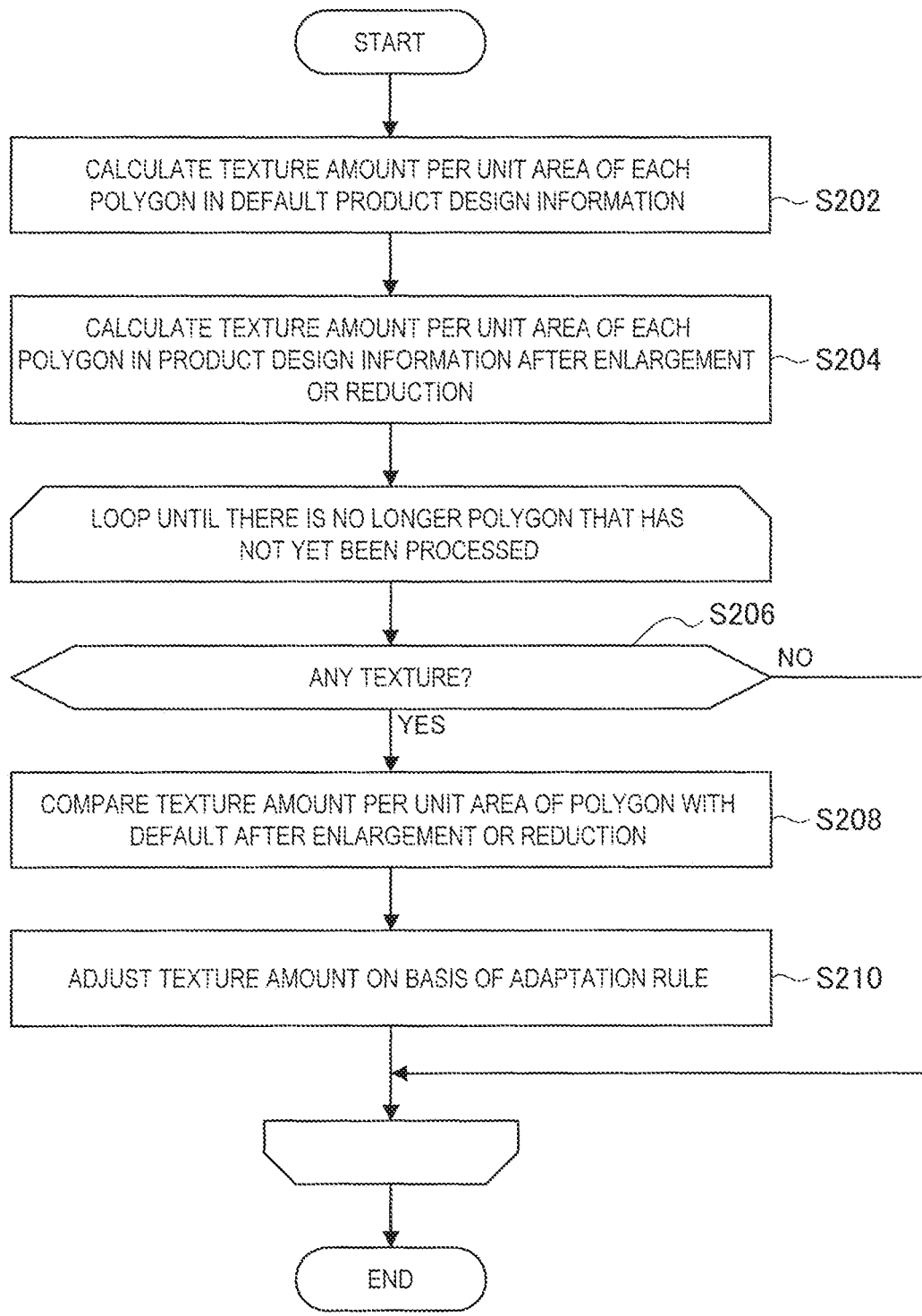
FIG. 12 is a flowchart illustrating an example of a flow of processing related to a texture amount adjustment according to the embodiment.

FIG. 12 is a flowchart illustrating an example of the flow of processing related to a texture amount adjustment according to the present embodiment. As illustrated in FIG. 12, the adaptation apparatus 140 (e.g., generation unit 143) first calculates the texture amount per unit area of each polygon in default product design information (step S202). Next, the adaptation apparatus 140 calculates the texture amount per unit area of each polygon in product design information after enlargement or reduction (step S204).

The adaptation apparatus 140 then changes polygons of interest sequentially, and repeatedly performs the following processing. First, the adaptation apparatus 140 determines whether a polygon of interest has a texture or not (step S206). In the case where it is determined that there is a texture (step S206/YES), the adaptation apparatus 140 compares the texture amount per unit area of a polygon with the default after enlargement or reduction (step S208). Next, the adaptation apparatus 140 adjusts the texture amount on the basis of an adaptation rule (step S210). For example, in the case where the adaptation rule indicates that the texture amount should be maintained before and after adaptation, the adaptation apparatus 140 adjusts the texture amount to obtain the same texture amount as the default. It is determined in step S206 that there is no texture (step S206/NO), the adaptation apparatus 140 makes no adjustment regarding the polygon of interest. This processing from step S206 to S210 is repeated until there is no longer a polygon that has not yet been processed.

The texture amount adjustment processing terminates here.

(5) Generation of Support Member Design Information

The adaptation apparatus 140 (e.g., generation unit 143) generates support member design information.

The adaptation apparatus 140 may generate support member design information on the basis of target information. With regard to clothing, the adaptation apparatus 140 generates, for skeleton data (e.g., a line connecting the right shoulder 304R to the right elbow 305R, and the like) of an arm portion having actual size, design information having the arm circumference 206 as its circumference, for example, as support member design information of a sleeve portion. This manufactures a support member along the adaptation target, so that it is possible to naturally shape the product along the adaptation target. In addition, the adaptation apparatus 140 may generate the support member design information on the basis of the adapted product design information and. With regard to clothing, the adaptation apparatus 140 generates design information of shape that fills the hollow of an adapted sleeve portion of clothing, for example, as support member design information of a sleeve portion. This makes it possible to faithfully reproduce a result of the adaptation processing regarding the product design information. Needless to say, the adaptation apparatus 140 may generate support member design information on the basis of both adapted product design information and target information. In the case there is a difference in between, weighting calculation or the like may be performed.

Here, if the thickness of a product (e.g., thickness of the fabrics of clothing) is taken into consideration, it is not desirable to manufacture a support member having exactly the same size as the size of the product. Therefore, the adaptation apparatus 140 may reduce the spaces between the apices of three-dimensional information included in support member design information to manufacture a support member several percentages smaller than the product. At that time, the adaptation apparatus 140 sets the reduction ratio by taking into consideration the characteristics (e.g., stretchability, expansivity, contractibility, and the like) of a material.

(6) Information Output

The adaptation apparatus 140 (output unit 145) outputs adapted design information that is generated to the manufacturing apparatus 130. The information to be output includes adapted product design information and support member design information. The adaptation apparatus 140 may divide, and then output the adapted product design information and the support member design information.

For example, the adaptation apparatus 140 (e.g., generation unit 143) may divide the adapted design information at the position of an apex associated with a feature point of a target. For example, the adaptation apparatus 140 divides the design information by using the size manufacturable for the manufacturing apparatus 130 as an upper limit. This makes it possible to manufacture a product by manufacturing each part, and then assembling the parts. It is desirable that a feature point for division be, for example, a joint position in the case where an adaptation target is a human. This is because, in the case of clothing, normally, for example, cloths are sewn together at a joint position such as a shoulder portion, so that it seems easy to accept division and assembly at a similar position. In addition, it is easier to adaptively manufacture such as using a material that is high in stretchability for a movable portion and using a material that is low in stretchability for other portions.

The above describes technical features of the adaptation apparatus 140 according to the present embodiment. Next, with reference to FIGS. 13 and 14, the flow of processing performed by the manufacturing system 100 according to the present embodiment will be described.

<3.2. Flow of Processing>

(1) Generation Policy Setting Processing

Figure 13:
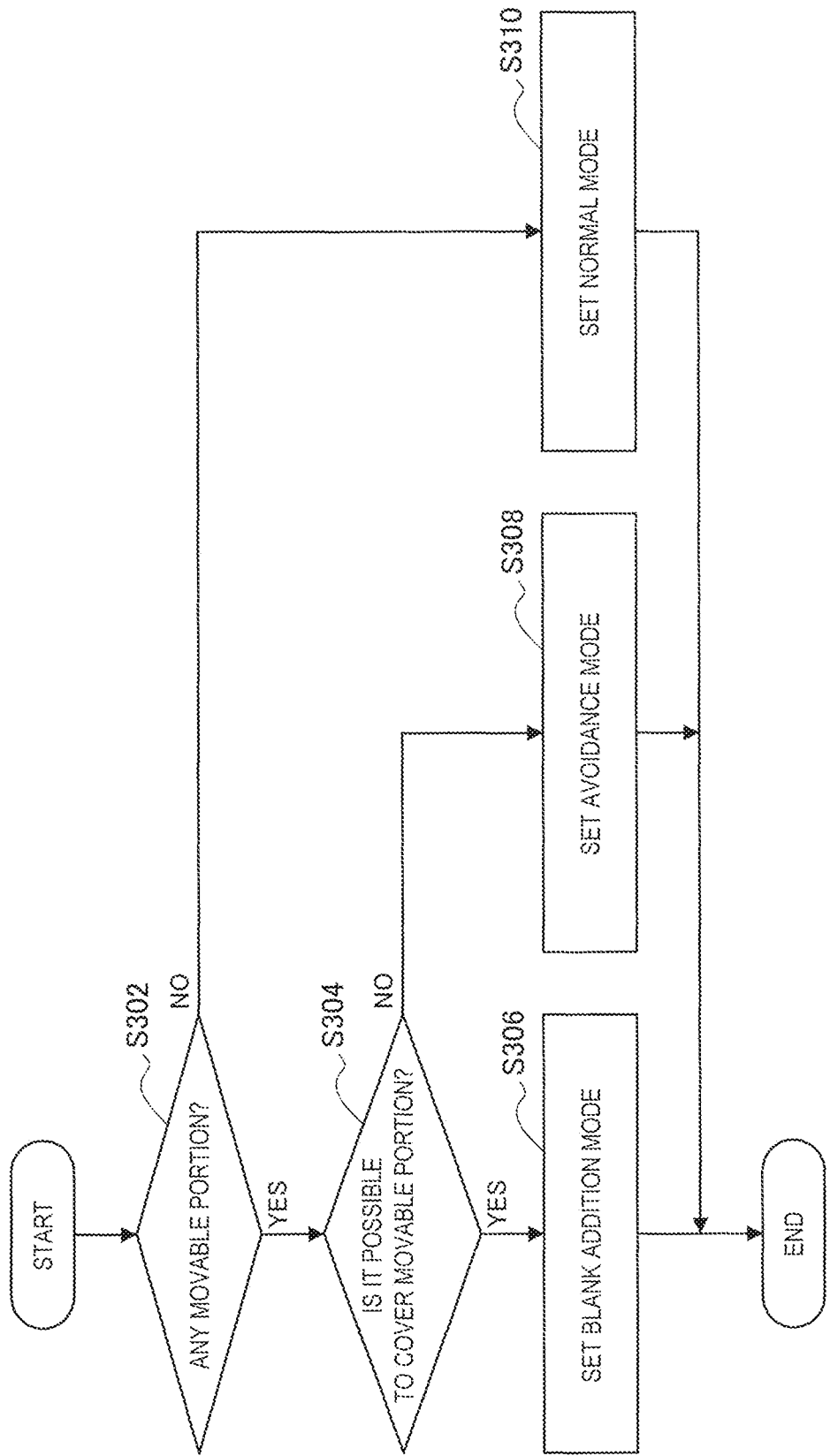
FIG. 13 is a flowchart illustrating an example of a flow of generation policy setting processing executed in the manufacturing system according to the embodiment.

FIG. 13 is a flowchart illustrating an example of the flow of generation policy setting processing executed in the manufacturing system 100 according to the present embodiment. The present processing is processing performed before product manufacturing processing that will be described below.

As illustrated in FIG. 13, the adaptation apparatus 140 (e.g., generation unit 143) first determines whether an adaptation target has a movable portion or not (step S302).

In the case where it is determined that there is no movable portion (step S302/NO), the adaptation apparatus 140 (e.g., generation unit 143) sets a normal mode as a generation policy (step S310).

In the case where there is a movable portion (step S302/YES), the adaptation apparatus 140 (e.g., generation unit 143) determines whether it is possible to cover the movable portion or not (step S304). For example, the adaptation apparatus 140 determines whether it is possible to cover or not, by determining whether the movement of the movable portion is interfered with or not in the case where a product that covers the movable portion is manufactured on the basis of the possible movement width of the movable portion, the stretchability of the material, and the like.

In the case where it is determined that it is possible to cover (step S304/YES), the adaptation apparatus 140 sets a blank space addition mode as the generation policy (step S306). In contrast, in the case where it is determined that it is difficult to cover (step S304/NO), the adaptation apparatus 140 sets an avoidance mode as the generation policy (step S306).

The generation policy setting processing terminates here.

(2) Product Manufacturing Processing

Figure 14:
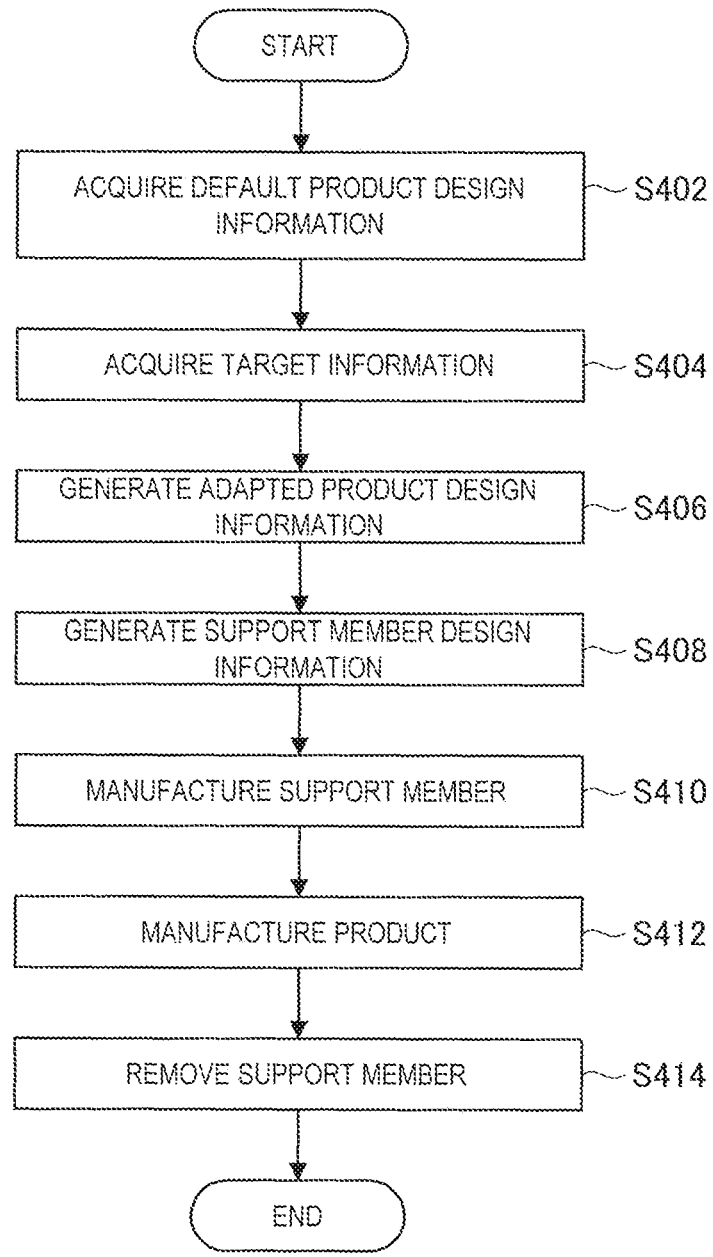
FIG. 14 is a flowchart illustrating an example of a flow of product manufacturing processing which is executed in the manufacturing system according to the embodiment.

FIG. 14 is a flowchart illustrating an example of the flow of product manufacturing processing which is executed in the manufacturing system 100 according to the present embodiment. Here, the flow of processing in the normal mode will be described.

As illustrated in FIG. 14, the adaptation apparatus 140 (e.g., first acquisition unit 141) first uses, for example, the communication apparatus 110 to acquire default product design information (step S402). The adaptation apparatus 140 (e.g., second acquisition unit 142) then uses, for example, the measurement apparatus 120 to acquire target information (step S404).

Next, the adaptation apparatus 140 (e.g., generation unit 143) generates adapted product design information (step S406). In the present step, the spaces between apices are enlarged or reduced, a feature point at an apex position is associated, an apex is added or deleted, the number of polygons is adjusted, a texture amount adjustment is made, and the like in accordance with the target information. The adaptation apparatus 140 (e.g., generation unit 143) then generates support member design information (step S408). Next, the adaptation apparatus 140 (e.g., output unit 145) outputs the adapted product design information and the support member design information to the manufacturing apparatus 130.

Next, the manufacturing apparatus 130 manufactures (i.e., prints) a support member on the basis of the support member design information (step S410). The manufacturing apparatus 130 then manufactures (i.e., prints) a product by superimposing (i.e., laminating or the like) the product on the support member on the basis of the adapted product design information (step S412). Afterward, the manufacturing apparatus 130 removes the support member (step S414).

The product manufacturing processing terminates here.

4. SECOND EMBODIMENT

The present embodiment is an embodiment in which, in the case where there has already been a support member, it is made possible to adapt product design information. The following describes a part of the technical features of the manufacturing system 100 according to the present embodiment which is different from the technical features described in the first embodiment.

<4.1. Technical Features>

(1) Target Information

In the present embodiment, an adaptation target is a support member. With regard to clothing, an adaptation target in the first embodiment is a person who wears clothing, but an adaptation target in the present embodiment is a support member on which clothing is superimposed in the manufacturing process. The adaptation apparatus 140 (e.g., second acquisition unit 142) acquires information regarding a support member as target information.

The adaptation apparatus 140 may acquire support member design information used to manufacture an existing support member or may acquire a scan result of an existing support member from a 3D scanner or the like as target information.

(2) Adaptation Processing of Product Design Information

The adaptation apparatus 140 (e.g., generation unit 143) generates product design information adapted to a target from default product design information, on the basis of target information. The adaptation apparatus 140 according to the present embodiment may enlarge or reduce the spaces between apices, associates a feature point at an apex position, adds or deletes an apex, adjusts the number of polygons, makes a texture amount adjustment, and the like without providing any margin between a support member that is an adaptation target and a product. With regard to clothing, the support member has already been shaped to secure a margin between the body and clothing, so that a further margin is not necessary.

Here, if the thickness of a product (e.g., thickness of the fabrics of clothing) is taken into consideration, it is not desirable to manufacture the product having exactly the same size as the size of a support member. Therefore, the adaptation apparatus 140 may enlarge the spaces between the apices of three-dimensional information included in product design information to manufacture a product several percentages smaller than a support member. At that time, the adaptation apparatus 140 sets the enlargement ratio by taking into consideration the characteristics (e.g., stretchability, expansivity, contractibility, and the like) of a material.

The above describes technical features of the adaptation apparatus 140 according to the present embodiment. Next, with reference to FIG. 15, the flow of processing performed by the manufacturing system 100 according to the present embodiment will be described.

<4.2. Flow of Processing>

Figure 15:
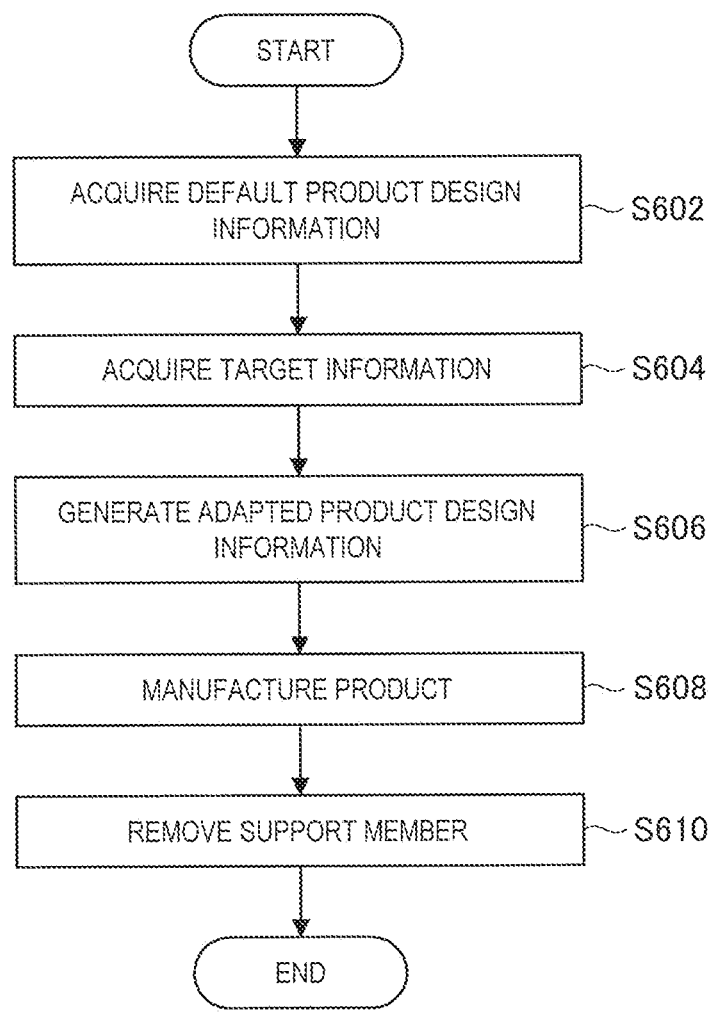
FIG. 15 is a flowchart illustrating an example of a flow of product manufacturing processing which is executed in a manufacturing system according to a second embodiment.

FIG. 15 is a flowchart illustrating an example of the flow of the product manufacturing processing which is executed in the manufacturing system 100 according to the present embodiment.

As illustrated in FIG. 15, the adaptation apparatus 140 (e.g., first acquisition unit 141) first uses, for example, the communication apparatus 110 to acquire default product design information (step S602). The adaptation apparatus 140 (e.g., second acquisition unit 142) then uses, for example, the measurement apparatus 120 to acquire target information regarding an existing support member (step S604).

Next, the adaptation apparatus 140 (e.g., generation unit 143) generates adapted product design information (step S606). In the present step, the spaces between apices are enlarged or reduced, a feature point at an apex position is associated, an apex is added or deleted, the number of polygons is adjusted, a texture amount adjustment is made, and the like in accordance with the target information. The adaptation apparatus 140 (e.g., output unit 145) outputs adapted product design information to the manufacturing apparatus 130.

The manufacturing apparatus 130 the manufacturing apparatus 130 then manufactures (i.e., prints) a product by superimposing (i.e., laminating or the like) the product on the existing support member on the basis of the adapted product design information (step S608). Afterward, the manufacturing apparatus 130 removes the support member (step S610).

The product manufacturing processing terminates here.

<<5. Hardware Configuration Example>>

Figure 16:
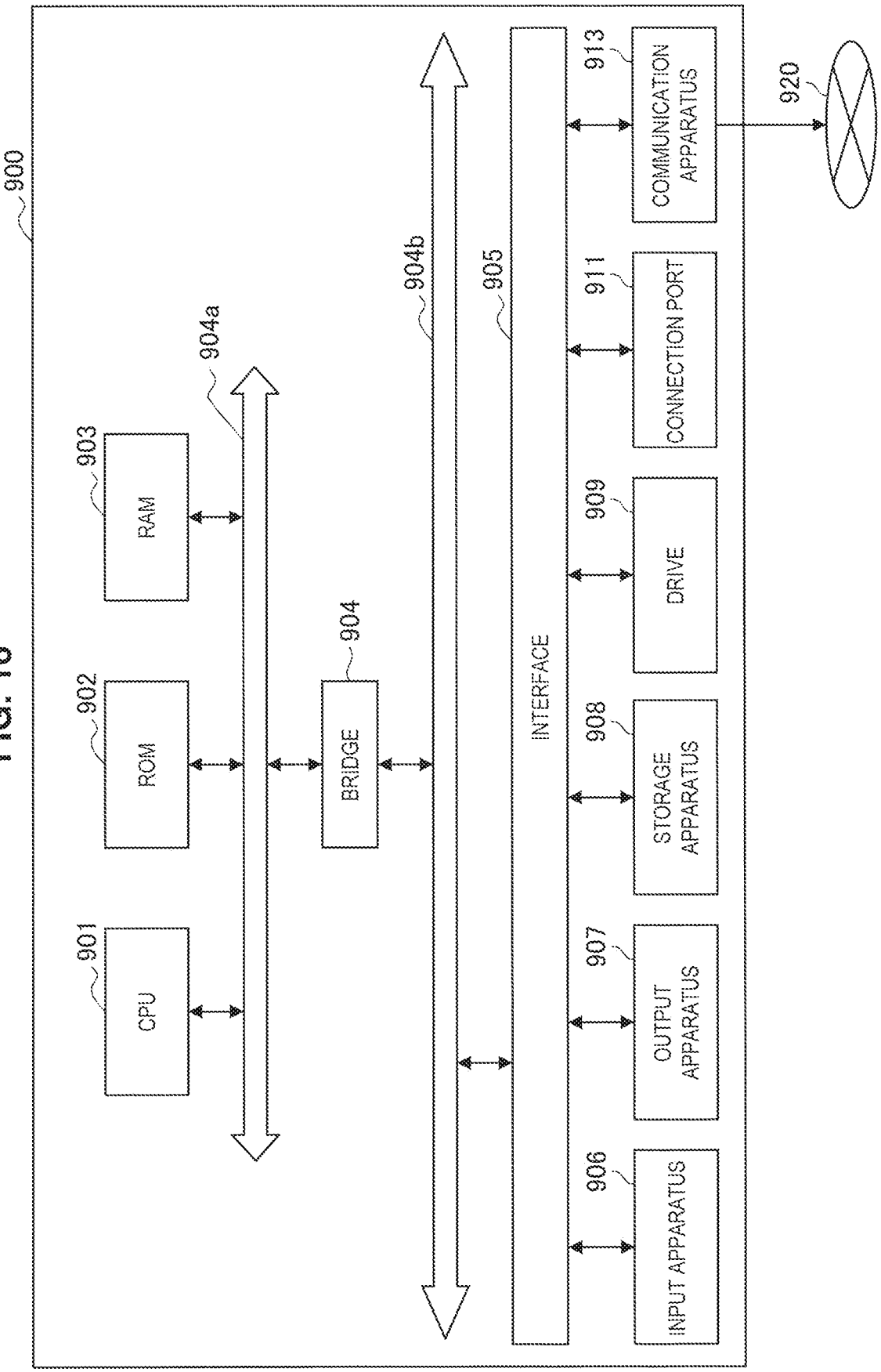
FIG. 16 is a block diagram illustrating an example of a hardware configuration of an information processing apparatus according to the embodiment.

Lastly, the hardware configuration of an information processing apparatus according to the present embodiment will be described with reference to FIG. 16. FIG. 16 is a block diagram illustrating an example of the hardware configuration of the information processing apparatus according to the present embodiment. Note that an information processing apparatus 900 illustrated in FIG. 16 can implement, for example, the adaptation apparatus 140 illustrated in FIG. 2. Information processing performed by the adaptation apparatus 140 according to the present embodiment is implemented in cooperation between software and hardware described below.

As illustrated in FIG. 16, the information processing apparatus 900 includes a central processing unit (CPU) 901, a read only memory (ROM) 902, a random access memory (RAM) 903, and a host bus 904*a*. In addition, the information processing apparatus 900 includes a bridge 904, an external bus 904*b*, an interface 905, an input apparatus 906, an output apparatus 907, a storage apparatus 908, a drive 909, a connection port 911, and a communication apparatus 913. The information processing apparatus 900 may include a processing circuit such as a DSP or an ASIC instead of or in combination with the CPU 901.

The CPU 901 functions as a processing apparatus and a control apparatus, and controls the overall operation of the information processing apparatus 900 in accordance with a variety of programs. In addition, the CPU 901 may be a microprocessor. The ROM 902 stores programs, operation parameters, and the like that the CPU 901 uses. The RAM 903 temporarily stores programs used in the execution of the CPU 901 and the parameters and the like that appropriately changes during the execution. The CPU 901 can form, for example, the first acquisition unit 141, the second acquisition unit 142, the generation unit 143, and the output unit 145 illustrated in FIG. 2.

The CPU 901, the ROM 902, and the RAM 903 are connected to each other by the host bus 904*a* including a CPU bus, or the like. The host bus 904*a* is connected to the external bus 904*b* such as a peripheral component interconnect/interface (PCI) bus through the bridge 904. Note that the host bus 904*a*, the bridge 904, and the external bus 904*b* are not necessarily configured as different components but the functions thereof may be implemented in a single bus.

The input apparatus 906 is implemented, for example, by an apparatus such as a mouse, a keyboard, a touch panel, a button, a microphone, a switch, and a lever into which a user inputs information. In addition, the input apparatus 906 may be, for example, a remote control apparatus using infrared light or other radio waves, or may be an external connection apparatus such as a mobile phone and a PDA operable in response to the operation of the information processing apparatus 900. Further, the input apparatus 906 may include, for example, an input control circuit or the like that generates an input signal on the basis of information input by a user using the above-described input means, and outputs the input signal to the CPU 901. A user of the information processing apparatus 900 is able to input a variety of data to the information processing apparatus 900 and instruct the information processing apparatus 900 to perform a processing operation by operating this input apparatus 906. In the present embodiment, the input apparatus 906 can receive a user input such as attribute information of an adaptation target.

The output apparatus 907 includes an apparatus capable of visually or aurally notifying a user of acquired information. Such an apparatus includes a display apparatus such as a CRT display apparatus, a liquid crystal display apparatus, a plasma display apparatus, an EL display apparatus, a laser projector, an LED projector and a lamp, a sound output apparatus such as a speaker and a headphone, a printer apparatus, and the like. The output apparatus 917 outputs, for example, results obtained from various types of processing performed by the information processing apparatus 900. Specifically, the display apparatus visually displays results obtained from various types of processing performed by the information processing apparatus 900 in a variety of forms such as text, an image, a table, and a graph. Meanwhile, the sound output apparatus converts audio signals including reproduced audio data, acoustic data, or the like into analog signals, and aurally outputs the analog signals.

The storage apparatus 908 is an apparatus for data storage which is configured as an example of a storage unit of the information processing apparatus 900. The storage apparatus 908 is implemented, for example, by a magnetic storage apparatus such as a HDD, a semiconductor storage device, an optical storage device, a magneto-optical storage device, or the like. The storage apparatus 908 may include a recording medium, a recording apparatus that records data in the recording medium, a readout apparatus that reads out data from the recording medium, a deletion apparatus that deletes data recoded in the recording medium, and the like. This storage apparatus 908 stores a program to be executed by the CPU 901, various kinds of data, various kinds of data acquired from the outside, and the like. The storage apparatus 908 can form, for example, the storage unit 144 illustrated in FIG. 2. In the present embodiment, the storage apparatus 908 temporarily stores, for example, data that is being adapted, or stores data that has been adapted.

The drive 909 is a reader/writer for a storage medium, and is built in or externally attached to the information processing apparatus 900. The drive 909 reads out information recorded on a removable storage medium such as a mounted magnetic disk, optical disc, magneto-optical disk, or semiconductor memory, and outputs the read-out information to the RAM 903. In addition, the drive 909 is also capable of writing information into a removable storage medium.

The connection port 911 is an interface connected to an external apparatus and is a port for connecting an external apparatus that is capable of data transmission through, for example, a universal serial bus (USB). In the present embodiment, the connection port 911 can be connected to the communication apparatus 110, the measurement apparatus 120, and the manufacturing apparatus 130. The connection port 911 can be included in the first acquisition unit 141, the second acquisition unit 142, and the output unit 145 illustrated in FIG. 2.

The communication apparatus 913 is, for example, a communication interface including a communication device and the like for a connection to a network 920. The communication apparatus 913 may be, for example, a communication card, and the like for a wired or wireless local area network (LAN), Long Term Evolution (LTE), BLUETOOTH (registered trademark), or a wireless USB (WUSB), or the like. In addition, the communication apparatus 913 may be a router for optical communication, a router for an asymmetric digital subscriber line (ADSL), a modem for various kinds of communication, or the like. This communication apparatus 913 is capable of transmitting and receiving signals or the like, for example, to and from the Internet or other communication apparatuses in compliance with a predetermined protocol such as TCP/IP.

Note that the network 920 is a wired or wireless transmission path through which information is transmitted from an apparatus connected to the network 920. The network 920 may include public networks such as the Internet, telephone networks and satellite networks, a variety of local area networks (LANs) including Ethernet (registered trademark), and wide area networks (WANs). In addition, the network 920 may also include leased line networks such as Internet protocol-virtual private networks (IP-VPNs).

The example of a hardware configuration that is capable of implementing the functions of the information processing apparatus 900 according to the present embodiment has been described above. Each of the above-described components may be implemented with a general-purpose member, and may also be implemented with hardware specialized in the function of each component. Thus, it is possible to modify the hardware configuration used as appropriate in accordance with the technological level at the time of the implementation of the present embodiment.

Note that it is possible to create a computer program for implementing each function of the information processing apparatus 900 according to the above-described embodiment, and implement the computer program in a PC or the like. It addition, it is also possible to provide a computer-readable recording medium having such a computer program stored therein. Examples of the recording medium include a magnetic disk, an optical disc, a magneto-optical disk, and a flash memory. In addition, the computer program may also be distributed via a network, for example, using no recording medium.

6. CONCLUSION

The above describes an embodiment of the present disclosure in detail with reference to FIGS. 1 to 16. As described above, the adaptation apparatus 140 according to the present embodiment generates design information adapted to an adaptation target from default product design information on the basis of target information of the adaptation target. This makes it easier to edit product design information to adapt the product design information to any object. For example, with regard to clothing, it is possible to generate product design information of clothing that fits into a user from default clothing design information.

In addition, the adaptation apparatus 140 according to the present embodiment is also capable of generating design information of a support member corresponding to adapted product design information. Therefore, it is also possible to adapt, and then manufacture a product that requires a support member. In addition, it is possible to adapt, and then manufacture a support member, so that the present technology does not require any procedure for separately manufacturing parts, and then assembling the parts while being fit.

In addition, the adaptation apparatus 140 according to the present embodiment is also capable of generating adapted product design information, which takes, into consideration, manufacture that uses an existing support member. This makes it possible to reuse a support member, resulting in the decreased amount of materials to be consumed and the shortened manufacturing time.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, in the above-described embodiments, the description is made, assuming the manufacturing apparatus 130 as a 3D printer. However, the present technology is not limited to the example. For example, the manufacturing apparatus 130 may be a cutting apparatus such as a 3D plotter, a numerical control machining apparatus that performs NC machining, or the like.

In addition, in the above-described embodiments, it is described that adapted product design information is used to manufacture a product. However, the present technology is not limited to the example. For example, it may also be used for simulation.

In addition, it is even possible to combine the above-described first embodiment with the above-described second embodiment. For example, the manufacturing system 100 may use an existing support member and newly superimpose support member to cover the existing support member, and then manufacture a product based on adapted product design information by superimposing the product on the new support member.

In addition, the manufacturing system 100 may be implemented as a single apparatus, or a part or the whole of the manufacturing system 100 may be implemented as different apparatuses. The same applies to the adaptation apparatus 140. For example, among examples of the functions and structures of the adaptation apparatus 140 illustrated in FIG. 2, the generation unit 143 and the storage unit 144 may be included in an apparatus such as a server connected to the first acquisition unit 141, the second acquisition unit 142, and the output unit 145 via a network, or the like.

The processing described herein with reference to the flowcharts and the sequence diagrams does not necessarily have to be executed in the illustrated order. Some processing steps may be executed in parallel. In addition, additional processing steps may also be adopted, while some of the processing steps may be omitted.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An information processing apparatus including:

a first acquisition unit configured to acquire default design information of a product;

a second acquisition unit configured to acquire target information of a target to which the product is to be adapted; and a generation unit configured to generate design information adapted to the target from the default design information acquired by the first acquisition unit on a basis of the target information acquired by the second acquisition unit.

(2)
The information processing apparatus according to (1), in which
the target information includes three-dimensional information of the target, and
the design information includes three-dimensional information of the product.
(3)
The information processing apparatus according to (2), in which
the generation unit enlarges or reduces a space between apices included in the three-dimensional information of the product.
(4)
The information processing apparatus according to (2) or (3), in which
the generation unit adds or deletes an apex to or from the three-dimensional information of the product included in the design information.
(5)
The information processing apparatus according to any one of (2) to (4), in which
the design information includes texture information, and
the generation unit maintains a texture amount per unit area before and after adaptation.
(6)
The information processing apparatus according to any one of (2) to (5), in which
the target information includes three-dimensional information of a feature point of the target,
the design information includes information indicating an apex in the three-dimensional information of the product corresponding to the feature point, and
the generation unit associates the feature point with the corresponding apex to make the adaptation.
(7)
The information processing apparatus according to any one of (2) to (6), in which
the target information includes attribute information of the target, and
the first acquisition unit estimates the three-dimensional information of the target from the attribute information of the target.
(8)
The information processing apparatus according to any one of (2) to (7), in which
the design information includes an adaptation rule, and
the generation unit makes the adaptation in accordance with the adaptation rule.
(9)
The information processing apparatus according to (8), in which
the adaptation rule includes information indicating a restriction as to a change in design information of the product.
(10)
The information processing apparatus according to any one of (2) to (9), in which
the generation unit divides the adapted design information at a position of an apex associated with a feature point of the target.
(11)
The information processing apparatus according to any one of (1) to (10), in which
the adapted design information is used to allow a 3D printer to manufacture the product.
(12)
The information processing apparatus according to (11), in which
the generation unit generates design information of an auxiliary member used to allow the 3D printer to manufacture the product.
(13)
The information processing apparatus according to (11), in which
the target is an auxiliary member used to allow the 3D printer to manufacture the product.
(14)
An information processing method including:
acquiring default design information of a product;
acquiring target information of a target to which the product is to be adapted; and
generating, by a processor, design information adapted to the target from the acquired default design information on a basis of the acquired target information.
(15)
A program for causing a computer to function as:
a first acquisition unit configured to acquire default design information of a product;
a second acquisition unit configured to acquire target information of a target to which the product is to be adapted; and
a generation unit configured to generate design information adapted to the target from the default design information acquired by the first acquisition unit on a basis of the target information acquired by the second acquisition unit.

REFERENCE SIGNS LIST

100 manufacturing system
110 communication apparatus
120 measurement apparatus
130 manufacturing apparatus
140 adaptation apparatus
141 first acquisition unit
142 second acquisition unit
143 generation unit
144 storage unit
145 output unit

The invention claimed is:
1. An information processing apparatus, comprising:
circuitry configured to:
acquire default design information of a product, wherein
the default design information includes three-dimensional information of the product, and
the three-dimensional information of the product includes apices;
measure a three-dimensional shape of a target for which the product is to be adapted;
acquire target information of the target based on the measurement;
edit the default design information based on the target information;
one of enlarge or reduce, based on the edited default design information, a space between the apices in the three-dimensional information of the product to obtain first modified design information;
determine a first texture amount per unit area in the edited default design information;
determine a second texture amount per unit area in the first modified design information;

compare the first texture amount per unit area and the second texture amount per unit area;

generate second modified design information of the product by one of addition of a new apex to the three-dimensional information of the product or deletion of an existing apex from the apices of the three-dimensional information of the product, wherein the one of the addition of the new apex or the deletion of the existing apex is based on the comparison; and generate first design information for the target based on the second modified design information of the product.

2. The information processing apparatus according to claim 1, wherein
the target information includes three-dimensional information of the target, and
the first design information includes the three-dimensional information of the product.

3. The information processing apparatus according to claim 2, wherein
the first design information includes texture information of the product.

4. The information processing apparatus according to claim 2, wherein
the three-dimensional information of the target includes a feature point of the target,
the first design information indicates an apex of the apices in the three-dimensional information of the product,
the apex corresponds to the feature point of the target, and
the circuitry is further configured to associate the feature point with the apex.

5. The information processing apparatus according to claim 2, wherein
the target information includes attribute information of the target, and
the circuitry is further configured to estimate the three-dimensional information of the target based on the attribute information of the target.

6. The information processing apparatus according to claim 2, wherein
the first design information includes an adaptation rule, and
the circuitry is further configured to generate the first design information based on the adaptation rule.

7. The information processing apparatus according to claim 6, wherein
the adaptation rule includes information that indicates a restriction, and
the restriction corresponds to an upper limit of changes in the three-dimensional information and texture information of the first design information for each type of the product.

8. The information processing apparatus according to claim 2, wherein
the circuitry is further configured to divide the first design information at a position of an apex, and
the apex is associated with a feature point of the target.

9. The information processing apparatus according to claim 1, wherein a 3D printer manufactures the product based on the first design information.

10. The information processing apparatus according to claim 9, wherein
the circuitry is further configured to generate second design information of an auxiliary member, and
the 3D printer manufactures the product based on the second design information.

11. The information processing apparatus according to claim 10, wherein the target is the auxiliary member.

12. An information processing method, comprising:
acquiring default design information of a product, wherein
the default design information includes three-dimensional information of the product, and
the three-dimensional information of the product includes apices;
measuring a three-dimensional shape of a target for which the product is to be adapted;
acquiring target information of the target based on the measurement;
editing the default design information based on the target information;
one of enlarging or reducing, based on the edited default design information, a space between the apices in the three-dimensional information of the product to obtain first modified design information;
determining a first texture amount per unit area in the edited default design information;
determining a second texture amount per unit area in the first modified design information;
comparing the first texture amount per unit area and the second texture amount per unit area;
generating second modified design information of the product by one of addition of a new apex to the three-dimensional information of the product or deletion of an existing apex from the apices of the three-dimensional information of the product, wherein the one of the addition of the new apex or the deletion of the existing apex is based on the comparison; and
generating specific design information for the target based on the second modified design information of the product.

13. A non-transitory computer-readable medium having stored thereon computer-readable instructions, which when executed by a computer, cause the computer to execute operations, the operations comprising:
acquiring default design information of a product, wherein
the default design information includes three-dimensional information of the product, and
the three-dimensional information of the product includes apices;
measuring a three-dimensional shape of a target for which the product is to be adapted;
acquiring target information of the target based on the measurement;
editing the default design information based on the target information;
one of enlarging or reducing, based on the edited default design information, a space between the apices in the three-dimensional information of the product to obtain first modified design information;
determining a first texture amount per unit area in the edited default design information;
determining a second texture amount per unit area in the first modified design information;
comparing the first texture amount per unit area and the second texture amount per unit area;
generating second modified design information of the product by one of addition of a new apex to the three-dimensional information of the product or deletion of an existing apex from the apices of the three-dimensional information of the product, wherein the one of the addition of the new apex or the deletion of the existing apex is based on the comparison; and
generating specific design information for the target based on the second modified design information of the product.

\* \* \* \* \*